United States Patent
Patra et al.

(10) Patent No.: US 11,137,688 B2
(45) Date of Patent: Oct. 5, 2021

(54) OPTICAL SYSTEM FOR TRANSFERRING ORIGINAL STRUCTURE PORTIONS OF A LITHOGRAPHY MASK, PROJECTION OPTICAL UNIT FOR IMAGING AN OBJECT FIELD IN WHICH AT LEAST ONE ORIGINAL STRUCTURE PORTION OF THE LITHOGRAPHY MASK IS ARRANGEABLE, AND LITHOGRAPHY MASK

(71) Applicant: Carl Zeiss SMT GmbH, Oberkochen (DE)

(72) Inventors: Michael Patra, Oberkochen (DE); Johannes Ruoff, Aalen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 0 days.

(21) Appl. No.: 17/092,978

(22) Filed: Nov. 9, 2020

(65) Prior Publication Data

US 2021/0055661 A1   Feb. 25, 2021

Related U.S. Application Data

(63) Continuation of application No. PCT/EP2019/061603, filed on May 7, 2019.

(30) Foreign Application Priority Data

May 9, 2018   (DE) .................... 10 2018 207 277.9

(51) Int. Cl.
G03F 7/20    (2006.01)

(52) U.S. Cl.
CPC .......... *G03F 7/70275* (2013.01); *G03F 7/701* (2013.01); *G03F 7/702* (2013.01); *G03F 7/70033* (2013.01)

(58) Field of Classification Search
CPC   G02B 17/0647; G02B 17/0663; G02B 13/08; G03F 7/70383; G03F 7/70775;
(Continued)

(56) References Cited

U.S. PATENT DOCUMENTS 9,366,968 B2   6/2016   Mann
10,656,400 B2   5/2020   Schwab
(Continued)

FOREIGN PATENT DOCUMENTS

DE     10317893 A1    11/2004
DE    102004008835 A1    9/2005
(Continued)

OTHER PUBLICATIONS

International Search Report, PCT/EP2019/061603, dated Jul. 25, 2019, 3 pages.
(Continued)

*Primary Examiner* — Mesfin T Asfaw
(74) *Attorney, Agent, or Firm* — Edell, Shapiro & Finnan LLC

(57) ABSTRACT

An optical system transfers original structure portions (13) of a lithography mask (10), which have an x/y-aspect ratio of greater than 4:1, and are aligned on the lithography mask, separated respectively by separating portions (14) that carry no structures to be imaged. The optical system transfers the original structure portions onto image portions (31) of a substrate (26). Each of the original structure portions is transferred to a separate image portion. The image portions onto which the original structure portions are transferred are arranged in a line next to one another. An associated projection optical unit may have an anamorphic embodiment with different imaging scales for two mutually perpendicular (Continued)

field coordinates specifically, one that is reducing for one of the field coordinates and the other is magnifying for the other field coordinates.

19 Claims, 10 Drawing Sheets

(58) Field of Classification Search
CPC .. G03F 7/70075; G03F 7/702; G03F 7/70666; G03F 7/70266; G03F 7/2008; G03F 7/70058; G03F 7/70233; G03F 7/70091; G03F 1/84; G03F 7/70475; G03F 7/70116; G03F 7/706; G03F 7/70191; G03F 7/70258; G03F 7/70158; G03F 7/7015; G03F 7/705; G03F 7/70066; G03F 7/70183; G03F 7/70241; G03F 7/70275; G03F 7/70033; G03F 7/701; G03F 1/22; G03F 1/24; G03F 7/70216; G03F 7/70225; G03F 1/86; G06T 7/0004; G06T 7/001; H01J 37/28; G21K 7/00
See application file for complete search history.

(56) References Cited

U.S. PATENT DOCUMENTS

| | | | |
|---|---|---|---|
| 2006/0073397 A1 | 4/2006 | Freund et al. | |
| 2006/0290919 A1 | 12/2006 | Jahnke et al. | |
| 2007/0058269 A1 | 3/2007 | Mann et al. | |
| 2010/0033698 A1 | 2/2010 | Sewell | |
| 2013/0128251 A1 | 5/2013 | Mann | |
| 2014/0377692 A1* | 12/2014 | Patra | G03F 7/70475 430/5 |
| 2015/0160561 A1 | 6/2015 | Saenger et al. | |
| 2016/0085061 A1 | 3/2016 | Schwab | |
| 2016/0327868 A1 | 11/2016 | Endres | |
| 2017/0285493 A1 | 10/2017 | Andre et al. | |
| 2019/0025574 A1 | 1/2019 | Li et al. | |

FOREIGN PATENT DOCUMENTS

| | | |
|---|---|---|
| DE | 102005009018 A1 | 9/2006 |
| DE | 102009011207 A1 | 10/2009 |
| DE | 2010029050 A1 | 3/2011 |
| DE | 102014208770 A1 | 1/2015 |
| WO | 2005098506 A1 | 10/2005 |
| WO | 2009053023 A1 | 4/2009 |
| WO | 2016166080 A1 | 10/2016 |
| WO | 2017161951 A1 | 9/2017 |
| WO | 2017199096 A1 | 11/2017 |

OTHER PUBLICATIONS

German Examination Report with English translation, Application No. 10 2018 207 277.9, dated Dec. 14, 2018, 11 pages.

* cited by examiner

OPTICAL SYSTEM FOR TRANSFERRING ORIGINAL STRUCTURE PORTIONS OF A LITHOGRAPHY MASK, PROJECTION OPTICAL UNIT FOR IMAGING AN OBJECT FIELD IN WHICH AT LEAST ONE ORIGINAL STRUCTURE PORTION OF THE LITHOGRAPHY MASK IS ARRANGEABLE, AND LITHOGRAPHY MASK

CROSS REFERENCE TO RELATED APPLICATIONS

This is a Continuation of International Application PCT/EP2019/061603 which has an international filing date May 7, 2019, and the disclosure of which is incorporated in its entirety into the present Continuation by reference. This Continuation also claims foreign priority under 35 U.S.C. § 119(a)-(d) to and also incorporates by reference, in its entirety, German Patent Application DE 10 2018 207 277.9 filed on May 9, 2018.

FIELD OF INVENTION

The invention relates to an optical system for transferring the original structure portions of a lithography mask. Further, the invention relates to a projection optical unit for projection lithography for imaging an object field in which at least one original structure portion of a lithography mask is arrangeable, an optical system comprising such a projection optical unit, a lithography mask comprising a plurality of original structure portions to be imaged, a projection exposure apparatus comprising such an optical system, a method for producing a microstructured or nanostructured component using such a projection exposure apparatus, and a microstructured or nanostructured component produced using this method.

BACKGROUND

Projection optical units of the type set forth at the outset are known from US 2013/0128251 A1, DE 10 2014 208 770 A1, US 2016/0327868 A1 and WO 2016/166 080 A1. Embodiments of projection exposure apparatus are furthermore known from US 2010/0033698 A1, WO 2017/199096 A1 and U.S. Pat. No. 9,366,968 B2. Further prior art is formed by DE 10 2005 009 018 A1, DE 10 2004 008 835 A1 and DE 103 17 893 A1.

SUMMARY

It is an object of the present invention to develop an optical system and a lithography mask of the type set forth at the outset in such a way that there is an increase in throughput of a projection exposure apparatus in which such a lithography mask or such an optical system is used.

According to the invention, this object is achieved by an optical system as described and claimed herein.

According to one aspect of the invention, it was recognized that it is possible to reduce a displacement outlay for a lithography mask by virtue of a plurality of original structure portions, which are arranged next to one another in a row, being present thereon. Then, during the projection exposure, it is possible to successively transfer the original structure portions of such a lithography mask onto a substrate, wherein, in particular, this can be implemented with the aid of a continuous scanning process with, in particular, an unchanging scanning speed. The aspect ratio of the extents of the dimensions of the respective original structure portions to be imaged is greater than 4 and facilitates the use of a transfer optical unit for transferring the original structure portions onto image portions of a substrate comprising different imaging scales in the two object dimensions. Such a transfer with different imaging scales is preferably such that the aspect ratio of the image portion respectively produced by an original structure portion lies closer to the value of 1 than the aspect ratio of the original structure portion. The aspect ratio of the respective original structure portion to be imaged can be greater than 4:1 (4/1), can be greater than 6:1, can be greater than 8:1, can be greater than 10:1, can be greater than 12:1, can be greater than 15:1 and can be 16:1, for example.

The optical system employs the advantages of such a lithography mask. A row of original structure portions on the lithography mask are transferred onto a row of image portions on the substrate with such an optical system. The overall length of the totality of the image portions being comparable to the substrate diameter leads to the option of covering the substrate with image portions via the optical system using few transfer processes. In particular, a transfer process can produce a row of image portions on the substrate, said row of image portions practically covering an entire diameter of the substrate. In this way, the substrate can be covered row-by-row or column-by-column, for example, wherein a complete row of image portions is produced on the substrate during each transfer and the transfer process is only interrupted when changing between the rows or when changing between the columns. The substrate can be round. Should the substrate deviate from a circular form, the diameter of the substrate is understood to mean a typical surface dimension of the substrate. In the case of a square substrate or rectangular substrate, this would be one of the side lengths or a mean value of the various side lengths, for example. Here, the dimension of the substrate extending along the direction in which the image portions of the considered totality of the image portions are arranged in a line next to one another is decisive.

A further object of the invention lies in developing a projection optical unit for projection lithography in such a way that a compact structure of the projection optical unit is facilitated.

According to the invention, this object is also achieved by a projection optical unit having the features as described and claimed herein.

The embodiment of the projection optical unit with one imaging scale that is reducing for one field coordinate and one imaging scale that is magnifying for the other field coordinate was surprisingly found to be not only suitable but even advantageous for projection lithography. Providing an optimal projection resolution along one of the field coordinates suffices for many components to be produced. A lower resolution can often be tolerated along the other field coordinate. The additional degree of freedom as a result thereof can be used to design projection optical units with optical components whose used optical surfaces deviate significantly from those of known projection optical units. By way of example, this can be used to provide catoptric projection optical units with compact folding geometries. At least one of the two imaging scales of the projection optical unit can be embodied to be negative, i.e., with image inversion. The phrases "magnifying" and "reducing" relate to the absolute value of the respective imaging scale. The image scale is magnifying if this absolute value is greater than 1 and the imaging scale is reducing if this absolute value is less than 1.

The projection optical unit can be a catoptric optical unit. Alternatively, the projection optical unit can be a dioptric or catadioptric optical unit. In relation to the guidance of an imaging beam path for imaging light, the projection optical unit can be realized only by way of mirrors, only by way of lens elements or by a combination of mirrors and lens elements.

Imaging scales as described and claimed herein were found to be particularly suitable for the purposes of projection lithography.

The advantages of the optical system as described and claimed herein correspond to those which have already been explained above with reference to the projection optical unit according to the invention.

An optical system as described and claimed herein achieves the two aforementioned objects in elegant fashion. In such a case, the projection optical unit can be designed in such a way that the original structure portions, which should be transferred into image portions in a manner aligned next to one another, can be arranged compactly on the lithography mask since there is magnifying imaging onto the respective image portion in the direction that the original structure portions are aligned, and so the original structure portions follow one another closely on the lithography mask in this direction.

An optical system as described and claimed herein facilitates a defined use of the substrate. Both a scanner operation and a stepper operation can be realized in this case.

A design of the optical system as described and claimed herein ensures that a displacement of the lithography mask along the scanning direction is comparatively small in comparison with the displacement of the substrate. On the lithography mask, this facilitates a compact embodiment along the scanning direction of an original structure portion to be transferred. An object-side numerical aperture of the projection optical unit in the field coordinate along the object displacement direction can be just as large, or else smaller than, the numerical aperture in the field coordinate perpendicular to the object displacement direction. An illumination beam path to the lithography mask and an imaging beam path away from the lithography mask can be separated from one another, or else they can coincide in terms of the chief ray directions, as is known from US 2015/0160561 A1, for example.

The advantages of an optical system as described and claimed herein correspond to those which were already explained above. An object-side numerical aperture of the illumination optical unit can also be embodied as matched to the numerical aperture of the projection optical unit.

As a light source as described and claimed herein, use can be made of an EUV light source, in particular in the wavelength range of between 5 nm and 30 nm, or else a DUV light source, for example in the wavelength region of 193 nm. If use is made of DUV wavelengths, use can be made of a catadioptric or dioptric projection optical unit.

The advantages of a lithography mask as described and claimed herein, a projection exposure apparatus as described and claimed herein, a production method as described and claimed herein and a component produced according to claim 14 correspond to those which have already been explained above, in particular with reference to the optical system and the projection optical unit. A microstructured or nanostructured component, in particular a semiconductor component, for example a memory chip, can be produced using the projection exposure apparatus.

BRIEF DESCRIPTION OF THE DRAWINGS

Exemplary embodiments of the invention are explained in greater detail below with reference to the drawing. In said drawing.

DETAILED DESCRIPTION

Figure 1:
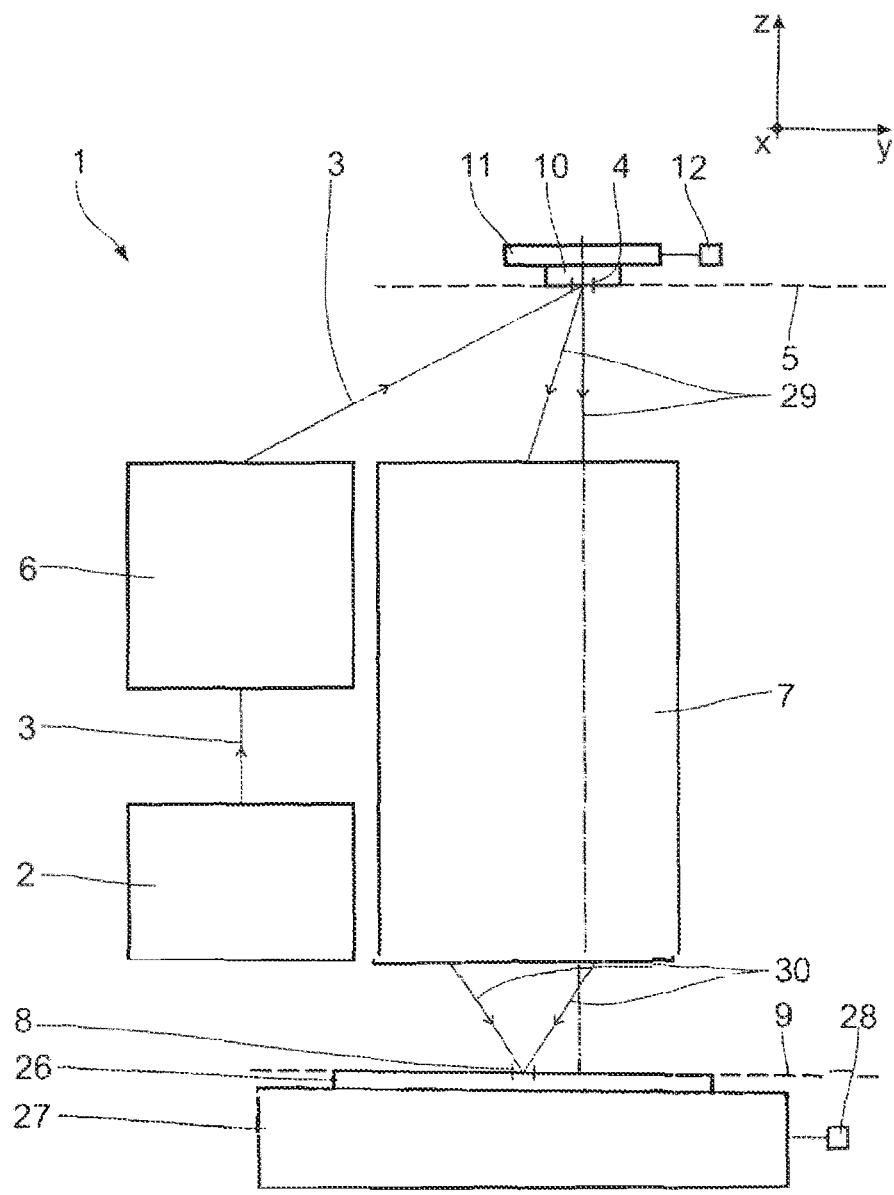
FIG. 1 schematically shows a microlithographic projection exposure apparatus.

A microlithographic projection exposure apparatus 1 has a light source 2 for illumination light or imaging light 3. The light source 2 is an EUV light source, which produces light in a wavelength range of e.g. between 5 nm and 30 nm, in particular between 5 nm and 15 nm. The light source 2 can be a plasma-based light source (laser-produced plasma (LPP), gas-discharge produced plasma (GDP)) or else a synchrotron-based light source, for example a free electron laser (FEL). In particular, the light source 2 may be a light source with a wavelength of 13.5 nm or a light source with a wavelength of 6.9 nm. Other EUV wavelengths are also possible. In general, even arbitrary wavelengths are possible for the illumination light 3 guided in the projection exposure apparatus 1, for example visible wavelengths or else other wavelengths which may find use in microlithography (for example DUV, deep ultraviolet) and for which suitable laser light sources and/or LED light sources are available (e.g. 365 nm, 248 nm, 193 nm, 157 nm, 129 nm, 109 nm). A beam path of the illumination light 3 is depicted very schematically in FIG. 1.

An illumination optical unit 6 serves to guide the illumination light 3 from the light source 2 to an object field 4 in an object plane 5. Using a projection optical unit or imaging optical unit 7, the object field 4 is imaged into an image field 8 in an image plane 9 with a predetermined reduction scale.

In order to facilitate the description of the projection exposure apparatus 1 and the various embodiments of the projection optical unit 7, a Cartesian xyz-coordinate system is indicated in the drawing, from which system the respective positional relationship of the components illustrated in the figures is evident. In FIG. 1, the x-direction extends perpendicularly to the plane of the drawing out of the latter. The y-direction extends to the right in FIG. 1 and the z-direction extends upwards.

In the projection optical unit 7, the object field 4 and the image field 8 have a bent or curved embodiment and, in particular, an embodiment shaped like a partial ring. A radius of curvature of this field curvature can be 81 mm on the image side. A basic form of a marginal contour of the object field 4 or of the image field 8 has a corresponding bend. Thus, a ring field radius of the image field 8 is 81 mm. Details in respect of this "ring field radius" parameter are found in WO 2005/098 506 A1. A definition of the ring field radius is found in WO 2009/053 023 A2. Alternatively, it is possible to embody the object field 4 and the image field 8 with a rectangular shape. The object field 4 and the image field 8 have an x/y-aspect ratio of greater than 1. Therefore, the object field 4 has a longer object field dimension in the x-direction and a shorter object field dimension in the y-direction. These object field dimensions extend along the field coordinates x and y.

Accordingly, the object field 4 is spanned by the first Cartesian object field coordinate x and the second Cartesian object field coordinate y. The third Cartesian coordinate z, which is perpendicular to these two object field coordinates x and y, is also referred to as normal coordinate below.

One of the exemplary embodiments still illustrated and described below can be used for the projection optical unit 7.

Figure 8:
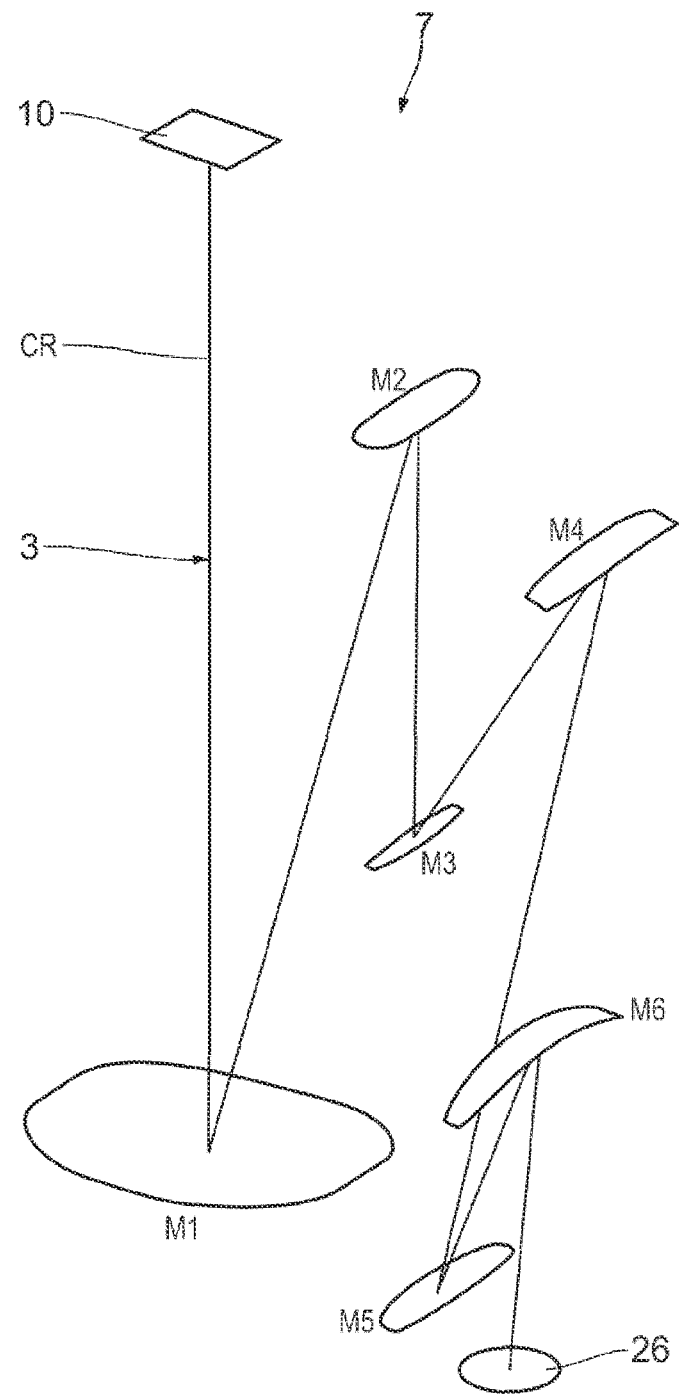
FIG. 8 shows, in perspective fashion, an arrangement of mirrors of an imaging optical unit, which is usable as a projection lens in the projection exposure apparatus of FIG. 1, in particular for imaging light with EUV wavelengths, wherein an imaging beam path is only indicated in the form of a chief ray of a central field point.
Figure 9:
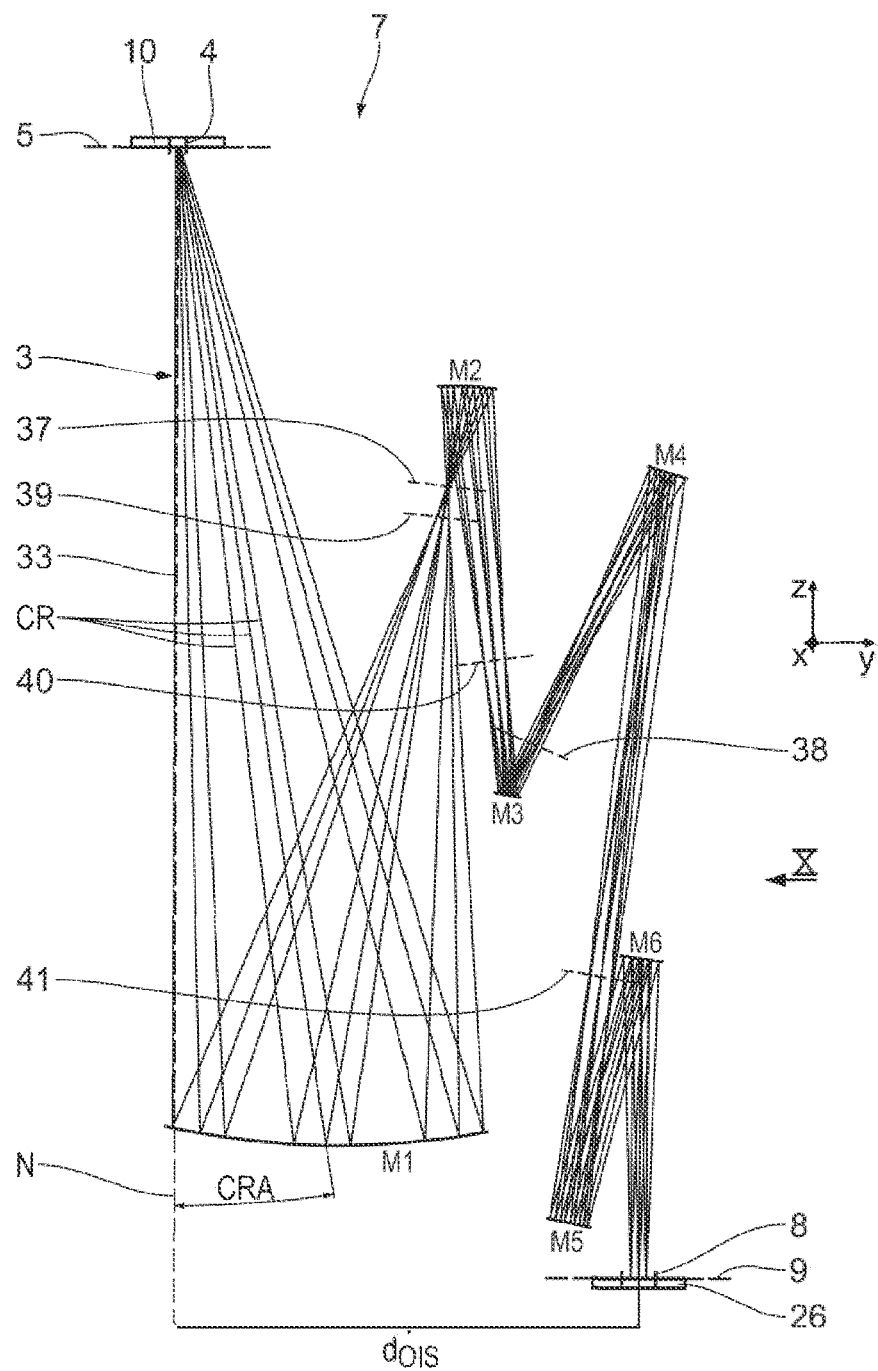
FIG. 9 shows a meridional section of the imaging optical unit according to FIG. 8.
Figure 10:
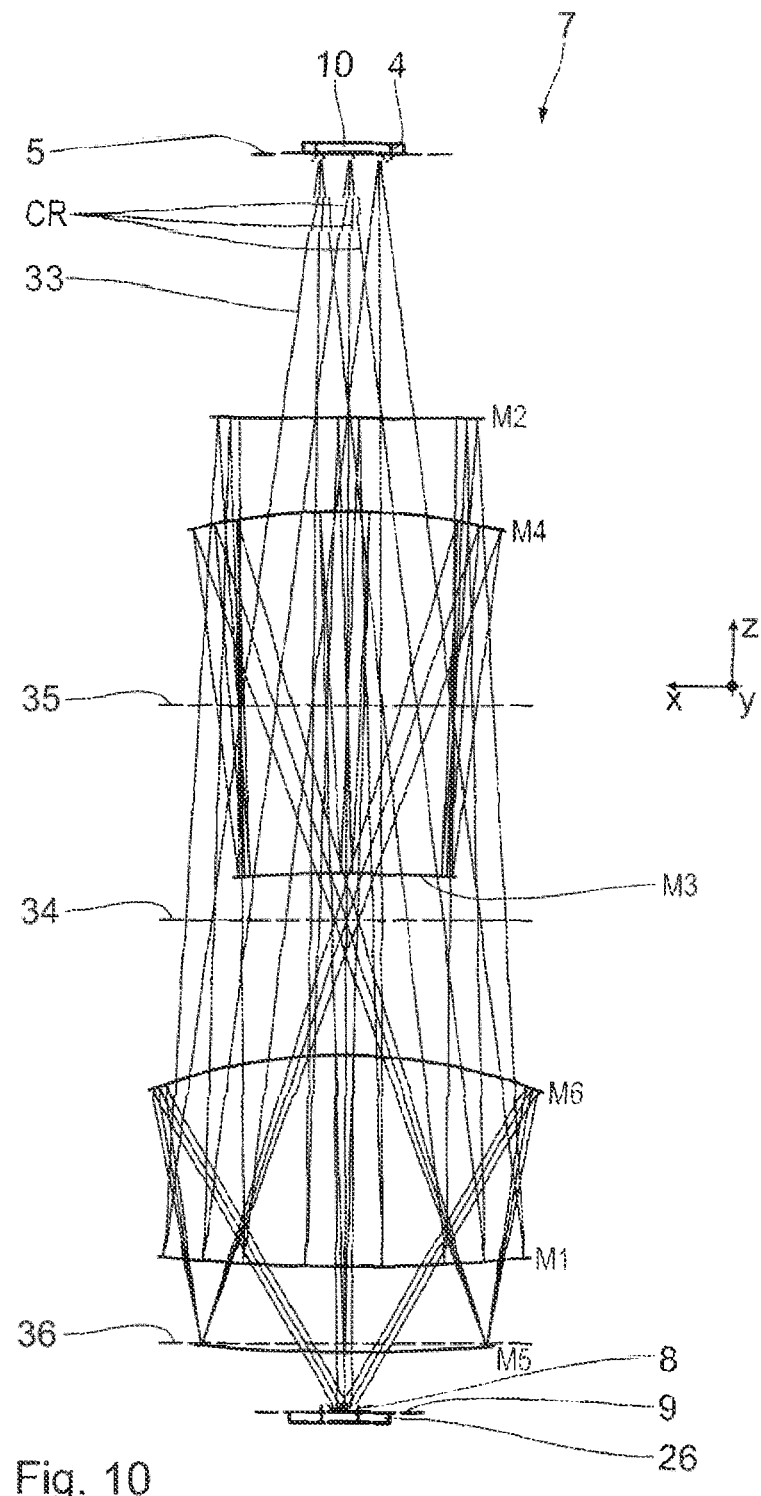
FIG. 10 shows a view from viewing direction X in FIG. 9.

A reflective catoptric variant of the projection optical unit 7 is described on the basis of FIGS. 8 to 10. The projection optical unit 7 according to FIGS. 8 to 10 reduces by a factor of 4 in a sagittal plane xz and magnifies by a factor of 4 in a meridional plane yz. An imaging scale $\beta_x$ in the sagittal plane xz is 0.25 and an imaging scale $\beta_y$ in the meridional plane yz is −4. The negative sign of $\beta_y$ means that there is an image flip when imaging the object field 4 into the image field 8. The projection optical unit 7 is an anamorphic projection optical unit. Other imaging scales in the two imaging light planes xz, yz are also possible, for example 3×, 5×, 6×, 7× or else imaging scales that are greater than 8×, or else imaging scales that are 1/3, 1/5, 1/6, 1/7, 1/8 or imaging scales that are smaller than 1/8. The respective reducing scale may or may not be accompanied by an image flip.

Figure 2:
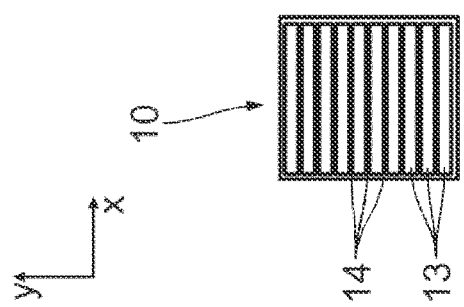
FIG. 2 shows a plan view of a lithography mask to be projected by the projection exposure apparatus, said lithography mask having a plurality of original structure portions to be imaged, which are arranged in a line next to one another.

In the case of the projection optical unit 7 in the embodiment according to FIG. 2, the image plane 9 is arranged parallel to the object plane 5. What is imaged in this case is a portion of a lithography mask 10, which is embodied as a reflection mask also referred to as reticle, coinciding with the object field 4. The reticle 10 is supported by a reticle holder 11. The reticle holder 11 is displaced by a reticle displacement drive 12. The displacement direction of the reticle displacement drive 12, which is also referred to as scanning direction, is the y-direction. The reticle holder 11 is also referred to as mask holder. The reticle displacement drive 12 is also referred to as mask displacement drive.

The lithography mask 10 is illustrated in a plan view in FIG. 2. The lithography mask 10 has a plurality of original structure portions 13 to be imaged, a total of ten in the illustrated exemplary embodiment, said original structure portions being arranged in a line next to one another in the y-direction. The original structure portions 13 are separated from one another by separating portions 14 that do not carry any structures to be imaged.

Figure 4:
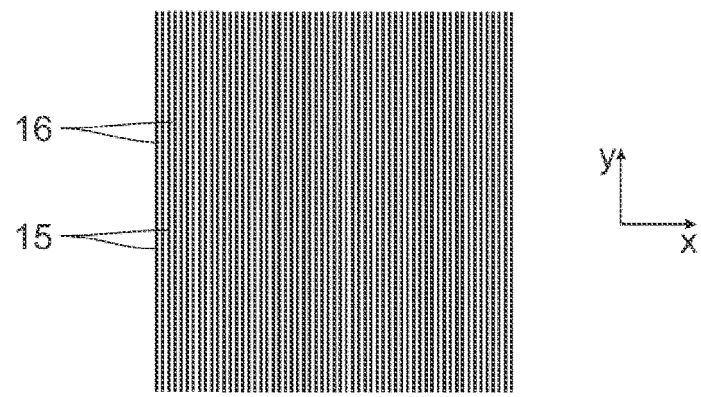
FIGS. 4 to 6 show various examples of imageable original structures, which may be arranged on the original structure portions of the lithography mask, specifically: simple dense lines separated by interstices (FIG. 4), lines separated by interstices forming banks separated by row interstices and column interstices (FIG. 5), and lines interrupted by line breaks and separated by interstices (FIG. 6)
Figure 5:
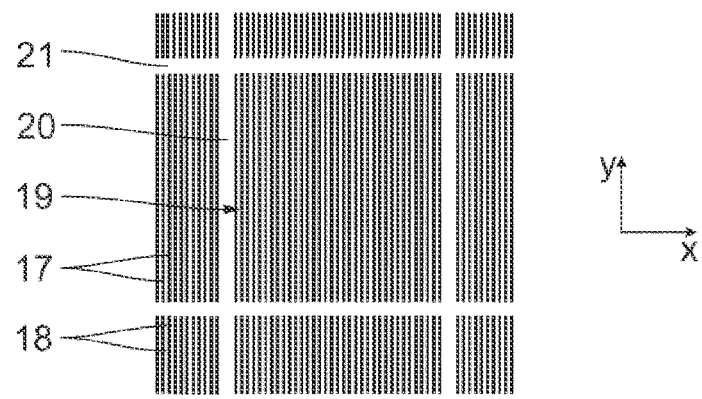
Figure 6:
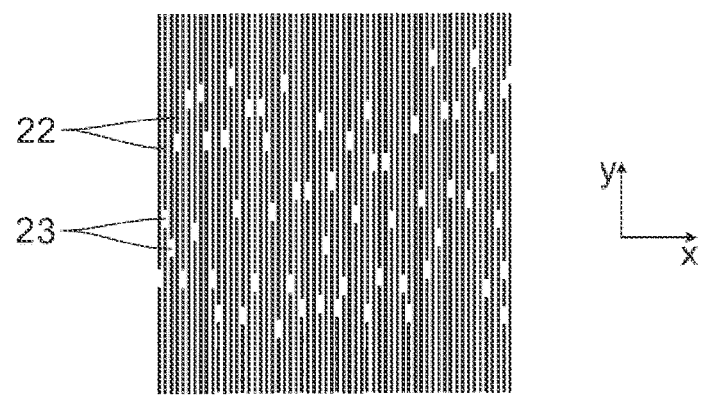

FIGS. 4 to 6 show examples of imageable structures, which may be arranged in the original structure portions 13 of the reticle 10.

FIG. 4 shows simple dense lines 15, which extend along the y-direction, as an example of such imageable structures. Adjacent ones of the lines 15 are separated from one another by line interstices 16 in each case.

FIG. 5 shows object structures, once again in the form of lines 17, which extend along the y-direction and which are separated from one another by line interstices 18 in a manner similar to the lines 15 according to FIG. 4. The lines 17 of the structures according to FIG. 5 are arranged in the form of rectangular and, for example, square line banks 19. The banks 19 are arranged in a regular row and column grid. Adjacent ones of the banks 19 are separated from one another within a row by row interstices 20 that extend in the scanning direction y and separated from one another within a column by column interstices 21 that extend along the x-direction. An extent of the row interstices 20 and the column interstices 21 on the one hand is many times greater than an extent of the line interstices 16 and 18 between adjacent lines 15 and 17 on the other hand and can be ten times that of the line interstices 16 and 18, for example.

In the structures according to FIG. 6, lines 22, which otherwise correspond to the lines 15 according to FIG. 4, are interrupted in the scanning direction y by line breaks 23. The breaks 23 can be arranged offset from one another in respect of the respective y-coordinate for different ones of the lines 22. Each of the lines 22 can have exactly one break 23 or else multiple breaks 23. Some of the lines 22 may also extend without interruption through the entire original structure portion 13 in the structure embodiment according to FIG. 6.

Figure 7:
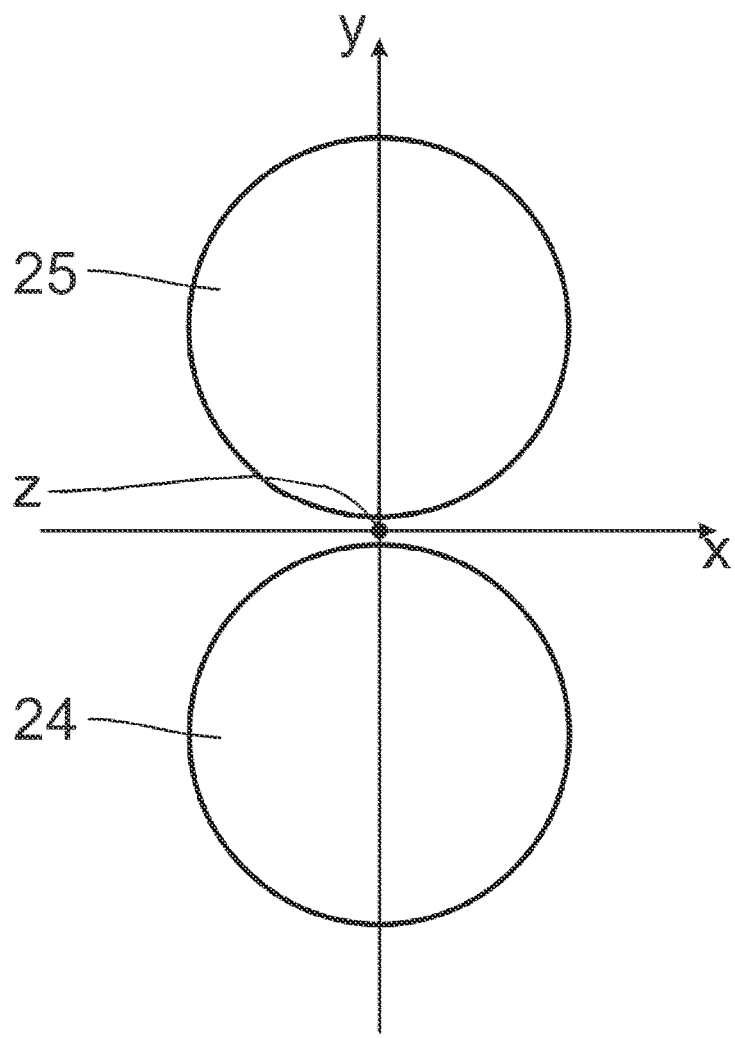
FIG. 7 shows a section extending parallel to an object plane through an illumination light beam path of the projection exposure apparatus near the lithography mask, wherein, firstly, a numerical aperture of an illumination light beam path of illumination light incident on the lithography mask and, secondly, a numerical aperture of the illumination light beam path reflected by the lithography mask are illustrated.

FIG. 7 elucidates numerical apertures of a beam path of the illumination light 3 in the case of a reflection at the lithography mask 10. Illustrated at the bottom of FIG. 7 is an angle space 24, in which the illumination light is guided to the lithography mask 10, i.e., a numerical aperture of the illumination light beam path before the lithography mask 10 is impinged. At the top, FIG. 7 shows an angle space 25, i.e., a numerical aperture, of the illumination light beam path after the lithography mask 10 has been impinged. This angle space 25 is matched to an object-side numerical aperture of the projection optical unit 7. The numerical apertures 24 and 25 are circular in the projection optical unit 7; i.e., they have the same diameter in the x- and y-direction. Accordingly, the following applies to the object-side numerical apertures $NA_O$, xz and $NA_O$, yz of the projection optical unit 7, firstly in the sagittal plane xz and secondly in the meridional plane yz:

$$NA_O, xz = NA_O, yz.$$

The imaging by way of the projection optical unit 7 is implemented on the surface of a substrate 26 in the form of a wafer, which is carried by a substrate holder 27. The substrate holder 27 is displaced by a wafer or substrate displacement drive 28.

FIG. 1 schematically illustrates, between the reticle 10 and the projection optical unit 7, a beam 29 (angle space 25; see FIG. 7) of the illumination light 3 that enters into said projection optical unit and, between the projection optical unit 7 and the substrate 26, a beam 30 of the illumination light 3 that emerges from the projection optical unit 7. An object-field-side numerical aperture ($NA_O$, yz) and an image-field-side numerical aperture ($NA_I$, yz) of the projection optical unit 7 are not reproduced true to scale in FIG. 1.

Figure 3:
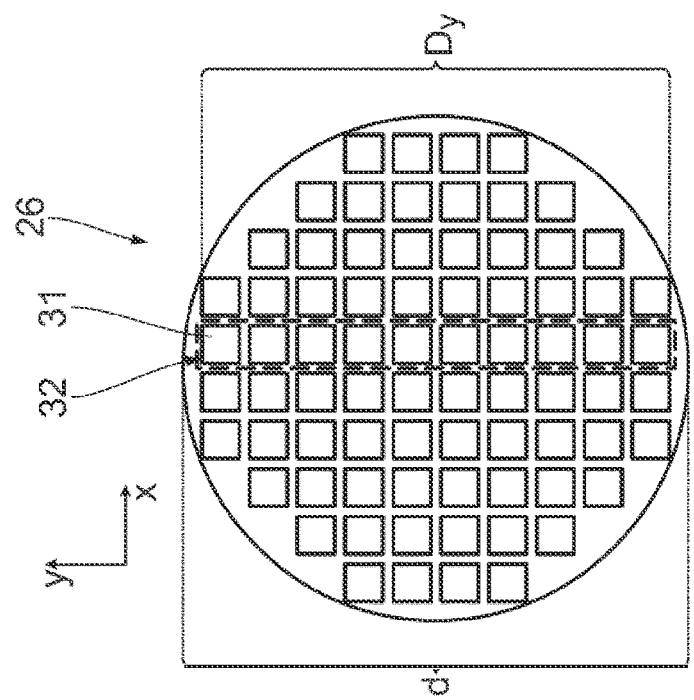
FIG. 3 a plan view of a substrate in the form of a wafer with image portions, onto which the original structure portions are transferred during the projection exposure, wherein a column of image portions, which are arranged in a line next to one another and on which the original structure portions of the lithography mask are transferred during a continuous scan, is highlighted.

FIG. 3 shows a plan view of the substrate 26. The substrate 26 has a diameter d. The substrate 26 has image portions 31, onto which the original structure portions 13 of the lithography mask 10 are transferred by imaging using the projection optical unit 7. A column 32 with ten image portions 31 that are arranged in a line next to one another in the scanning direction y, on which the ten original structure portions 13 of the lithography mask 10 are imaged, is highlighted by a dashed frame. This column 32 of the image portions 31 represents a totality of image portions 31 which are produced on the substrate 26 as images of the ten original structure portions 13 during a single uninterrupted transfer process using the projection optical unit 7. The column 32 has a y-extent $D_y$. The following applies: $D_y > d/2$. Thus, the totality of the image portions 31 that can be produced on the substrate 26 by imaging the ten original structure portions 13 has an extent $D_y$ along the scanning direction y, which is greater than half of the diameter d of the substrate 26. The following even applies in the illustrated embodiment: $D_y \cong d$.

The image portions 31 are square in each case; i.e., they have an x/y-aspect ratio of 1/1. Correlated with the imaging scales $\beta_x$ of 0.25 and $\beta_y$ of –4, specified above, this yields an x/y-aspect ratio of the original structure portions 13 of 16/1.

Depending on the embodiment of the projection optical unit 7, the respective original structure portion may have an xy-aspect ratio that is greater than 4:1 (4/1), for example an x/y-aspect ratio of 5/1, of 6/1, of 7/1, of 8/1, of 10/1, of 12/1 or else of 15/1.

Once again, depending on the embodiment, the image portions 31 may also have an x/y-ratio that deviates from 1/1, for example an x/y-aspect ratio of 13/16.

An overall extent of the lithography mask 10 along the y-direction can lie in the range of between 120 mm and 160 mm and, in particular, in the range of between 128 mm and 152 mm. A diameter of the e.g. round substrate 26 may lie in the range of between 300 mm and 450 mm. The absolute value of the magnifying imaging scale $\beta_y$ may lie at 1.97, at 2.11, at 2.34, at 2.69, at 3.17 or else at 3.51.

Depending on the embodiment of the projection optical unit 7, the reducing imaging scale $\beta_x$ can lie in the absolute value range of between ⅛ and ⅓. Depending on the embodiment of the projection optical unit 7, the magnifying imaging scale $\beta_y$ can lie in the absolute value range of between 1.5 and 5.

The field coordinate y, for which the projection optical unit 7 has a magnifying embodiment, coincides with the object displacement direction y.

In each case, at least one original structure portion 13 of the lithography mask 10 is arrangeable in the object field 4. In each case, at least one image portion 31 of the substrate 26 is arrangeable in the image field 8.

During the projection exposure, the lithography mask 10 on the one hand and the substrate 26 on the other hand are displaced in synchronized fashion with one another in such a way that the original structure portions 13 are transferred to respectively one column of the image portions 31, for example on the column 32, during a continuous scan along the scanning direction y. In this transfer, each of the original structure portions 13 is transferred onto a separate image portion 31 of the substrate 26. This is implemented for each of the columns of the image portions 31 on the substrate 26, wherein, after the completed transfer of the original structure portions 13 onto the entire respective column of the image portions 31, the substrate 26 is displaced by one column distance along the x-direction. Scans in relation to adjacent columns of the image portions 31 can be implemented in the respective opposite scanning direction; i.e., for example, the scan of the column 32 can be implemented in the positive y-direction and the scan of the subsequent column of the image portions 31, for example the column adjacent to the right of the column 32, can be implemented in the negative y-direction. To the extent that the respective column of the image portions 31 has fewer than ten image portions 31, the respective scan is terminated after transferring the appropriate number of object structure portions 13 for this column and the next column of the image portions 31 is then scanned.

The projection exposure apparatus 1 is of the scanner type. Both the reticle 10 and the substrate 26 are scanned in the y-direction during the operation of the projection exposure apparatus 1. A stepper type of the projection exposure apparatus 1, in which a stepwise displacement of the reticle 10 and the substrate 26 in the y-direction is implemented between individual exposures of the substrate 26, is possible. These displacements are implemented synchronously to one another by an appropriate actuation of the displacement drives 12 and 28. A central control device, not illustrated in the drawing, of the projection exposure apparatus 1 serves to synchronize the drives 12, 28.

Below, the projection optical unit 7 is explained in more detail on the basis of FIGS. 8 to 10. The projection optical unit 7 is an example for a catoptric embodiment.

FIG. 8 shows the projection optical unit 7 in perspective, wherein, for the purposes of elucidating a beam path of the imaging light 3, a chief ray CR of a central field point only is illustrated between the schematically indicated lithography mask 10 at the location of the object field and the likewise schematically indicated substrate 26 at the location of the image field.

FIG. 9 shows the projection optical unit 7 in a meridional section, i.e. the beam path of the imaging light 3 in the yz-plane. FIG. 10 shows the imaging beam path of the projection optical unit 7 in the sagittal plane xz.

FIG. 9 depicts the beam path of in each case three individual rays 33 emanating from three object field points which are spaced apart from one another in the y-direction in FIG. 9. What is depicted are chief rays CR, i.e. individual rays 33 which pass through the centre of a pupil in a pupil plane of the projection optical unit 7, and in each case an upper coma ray and a lower coma ray of these three object field points. Proceeding from the object field 4, the chief ray CR of a central object field point includes an angle CRA of approximately 8° with a normal N on the object plane 5.

In the imaging beam path between the object field 4 and the image field 8, the projection optical unit 7 has a total of six mirrors, which are denoted by M1 to M6 in the sequence of their impingement along the imaging light beam path.

FIG. 10 likewise illustrates the beam path of likewise three individual rays, which likewise emanate from three object field points which are spaced apart from one another in the x-direction in FIG. 3. Once again, chief rays CR and two respective edge-side coma rays are illustrated.

The object plane 5 lies parallel to the image plane 9.

In the projection optical unit 7, all mirrors M1 to M6 are configured as mirrors for normal incidence, that is to say as mirrors onto which the imaging light 3 impinges with an angle of incidence that is less than 45°. These mirrors for normal incidence are also referred to as NI (normal incidence) mirrors.

The mirrors M1 to M6 carry a coating that optimizes the reflectivity of the mirrors M1 to M6 for the imaging light 3. Here, this can be a ruthenium coating or a multilayer with, in each case, an uppermost layer made of ruthenium, for example. These highly reflecting layers, in particular of the mirrors M1 to M6 for normal incidence, can be configured as multi-ply layers, wherein successive layers can be manufactured from different materials. Alternating material layers can also be used. A typical multi-ply layer can have fifty bilayers, respectively made of a layer of molybdenum and a layer of silicon. These may contain additional separation layers made of e.g. C (carbon) or $B_4C$ (boron carbide) and be terminated by a protective layer or a protective layer system toward the vacuum.

In the first imaging light plane xz, the projection optical unit 7 has a numerical aperture $NA_O$, xz of 0.125 on the object side. In the second imaging light plane yz, the projection optical unit 7 has a numerical aperture $NA_O$, yz of likewise 0.125 on the object side. On the image side, the projection optical unit 7 has a numerical aperture $NA_I$, xz of 0.5 in the first imaging light plane and a numerical aperture $NA_I$, yz of 0.5/16=0.03125 in the second imaging light plane.

None of the mirrors M1 to M6 includes a passage opening for the imaging light. All mirrors M1 to M6 are thus used in a reflective manner in a continuous region without gaps.

In the first imaging light plane xz (first plane), the projection optical unit 7 has exactly one first plane intermediate image in an intermediate image plane 34, which lies between the mirrors M4 and M5 in the imaging light beam path. A first first-plane pupil plane 35 lies between the mirrors M2 and M3 in the imaging light beam path between the object field 4 and the first plane intermediate image plane 34. A second first-plane pupil plane 36 lies in the region of a reflection of the imaging light of the mirror M5.

In the second imaging light plane yz (second plane), the projection optical unit 7 has two second plane intermediate image planes 37, 38. The first second-plane intermediate image plane 37 lies between the mirrors M1 and M2 in the imaging light beam path. The other second-plane intermediate image plane 38 lies between the mirrors M3 and M4 in the imaging light beam path. A first second-plane pupil plane 39 lies between the mirrors M1 and M2 in the imaging light beam path, just in front of the first second-plane intermediate image plane 37. A further second-plane pupil plane 40 lies between the mirrors M2 and M3 in the imaging light beam path. This second second-plane pupil plane 40 coincides with the first first-plane pupil plane 35. A third second-plane pupil plane 41 lies between the mirrors M4 and M5 in the imaging beam path, spatially adjacent to the mirror M6.

The second-plane pupil plane 40 is arranged in a portion of the imaging beam path that is completely accessible on the circumferential side such that an aperture stop acting for one of the two imaging light planes xz, yz can be arranged there.

An aperture stop that acts as alternatively or additionally for the first imaging light plane xz can be arranged in the region of the mirror M5, for example as a mirror coating.

The projection optical unit 7 is telecentric on the image side. The deviation from telecentricity is low on the object side.

The mirrors M1 to M6 are embodied as free-form surfaces which cannot be described by a rotationally symmetric function. Other embodiments of the projection optical unit 7, in which at least one of the mirrors M1 to M6 is embodied as a rotationally symmetric asphere, are also possible. An asphere equation for such a rotationally symmetric asphere is known from DE 10 2010 029 050 A1. It is also possible for all mirrors M1 to M6 to be embodied as such aspheres.

A free-form surface can be described by the following free-form surface equation (equation 1):

$$Z = \frac{c_x x^2 + c_y y^2}{1 + \sqrt{1 - (1+k_x)(c_x x)^2 - (1+k_y)(c_y y)^2}} + \\ C_1 x + C_2 y + C_3 x^2 + C_4 xy + C_5 y^2 + C_6 x^3 + \ldots + \\ C_9 y^3 + C_{10} x^4 + \ldots + C_{12} x^2 y^2 + \ldots + C_{14} y^4 + C_{15} x^5 + \\ \ldots + C_{20} y^5 + C_{21} x^6 + \ldots + C_{24} x^3 y^3 + \ldots + C_{27} y^6 + \ldots \quad (1)$$

The following applies to the parameters of this equation (1):

Z is the sagittal height of the free-form surface at the point x, y, where $x^2+y^2=r^2$. Here, r is the distance from the reference axis of the free-form surface equation (x=0; y=0).

In the free-form surface equation (1), $C_1$, $C_2$, $C_3$ . . . denote the coefficients of the free-form surface series expansion in powers of x and y.

In the case of a conical base area, $c_x$, $c_y$ is a constant corresponding to the vertex curvature of a corresponding asphere. Thus, $c_x=1/R_x$ and $c_y=1/R_y$ applies. $k_x$ and $k_y$ each correspond to a conical constant of a corresponding asphere. Thus, equation (1) describes a biconical free-form surface.

An alternative possible free-form surface can be produced from a rotationally symmetric reference surface. Such free-form surfaces for reflection surfaces of the mirrors of projection optical units of microlithographic projection exposure apparatuses are known from US 2007/0058269 A1.

It is also possible to use other polynomial systems within the scope of the mathematical description of the free-form surfaces, for example, Zernike polynomials, Chebyshev polynomials, Legendre polynomials or Forbes polynomials.

Alternatively, free-form surfaces can also be described with the aid of two-dimensional spline surfaces. Examples for this are Bezier curves or non-uniform rational basis splines (NURBS). By way of example, two-dimensional spline surfaces can be described by a grid of points in an xy-plane and associated z-values, or by these points and gradients associated therewith. Depending on the respective type of the spline surface, the complete surface is obtained by interpolation between the grid points using for example polynomials or functions which have specific properties in respect of the continuity and differentiability thereof. Examples for this are analytical functions.

The projection optical unit 7 is designed for an operating wavelength of the illumination light 3 of 13.5 nm. The image field 8 has an x-extent of 26 mm and a y-extent of 30 mm.

The optical design data of the reflection surfaces of the mirrors M1 to M6 of the projection optical unit 7 can be gathered from the following tables. These optical design data in each case proceed from the image plane 9, i.e. describe the respective projection optical unit in the reverse propagation direction of the imaging light 3 between the image plane 9 and the object plane 5.

The first of these tables provides vertex point radii (Radius_x=$R_x$, Radius_y=$R_y$) and refractive power values (Power_x, Power_y) for the optical surfaces of the optical components. To the extent that the specification for the value $R_y$ is missing, the following applies: $R_x=R_y$. Negative values of radius mean curves which are concave toward the incident illumination light 3 in the section of the respective surface with the considered plane (xz, yz), which is spanned by a surface normal at the vertex point with the respective direction of curvature (x, y). The two radii Radius_x, Radius_y may explicitly have different signs.

The vertex points at each optical surface are defined as points of incidence of a guide ray which travels from an object field centre to the image field 8 along a plane of symmetry x=0, i.e. the plane of the drawing of FIG. 9 (meridional plane).

The refractive powers Power_x ($P_x$), Power_y ($P_y$) at the vertex points are defined as:

$$P_x = -\frac{2 \cos AOI}{R_x}$$

$$P_y = -\frac{2}{R_y \cos AOI}$$

Here, AOI denotes an angle of incidence of the guide ray with respect to the surface normal.

The second table indicates for the mirrors M1 to M6 in mm the conic constants $k_x$ and $k_y$, the vertex point radius $R_x$ (=Radius_x) and the free-form surface coefficients $C_n$. Coefficients $C_n$ that are not tabulated have the value 0 in each case.

The third table still specifies the absolute value along which the respective mirror, proceeding from a reference surface, was decentred (DCY) in the y-direction, and displaced (DCZ) and tilted (TLA, TLC) in the z-direction. This corresponds to a parallel shift and a tilting in the case of the free-form surface design method. Here, a displacement is carried out in the y-direction and in the z-direction in mm, and tilting is carried out about the x-axis and about the z-axis. In this case, the angle of rotation is specified in degrees. Decentring is carried out first, followed by tilting. The reference surface during decentring is in each case the first surface of the specified optical design data. Decentring in the y-direction and in the z-direction is also specified for the object field 4. In addition to the surfaces assigned to the individual mirrors, the third table also tabulates the image plane as the first surface and a stop surface (with the label "AS").

The fourth table describes an inner edge contour of aperture stop AS that delimits the imaging light beam path in the pupil planes 35 and 40, respectively, on the edge side. The description of the edge contour is implemented on the basis of a polygonal chain on the surface AS, which is represented by appropriate x- and y-values. An edge of a stop surface of the stop AS emerges from intersection points on the stop surface of all rays of the illumination light 3 which, on the image side, propagate at the field centre point in the direction of the stop surface with a complete image-side telecentric aperture. When the stop is embodied as an aperture stop, the boundary is an inner boundary.

TABLE 1 for FIG. 8

| Surface | Radius x[mm] | Power x[1/mm] | Radius y[mm] | Power y[1/mm] | Operating |
|---|---|---|---|---|---|
| M6 | −968.4835569 | 0.0020457 | −2718.5280535 | 0.0007427 | REFL |
| M5 | −2498.9884733 | 0.0007974 | −2133.5415828 | 0.0009409 | REFL |
| M4 | −1133.2675512 | 0.0017405 | −1027.5593219 | 0.0019736 | REFL |
| M3 | 3080.8489653 | −0.0006275 | −4246.7799758 | 0.0004872 | REFL |
| M2 | −33479.9102101 | 0.0000590 | −336.6830901 | 0.0060107 | REFL |
| M1 | −3172.7286161 | 0.0006207 | −1567.5265176 | 0.0012958 | REFL |

TABLE 2a for FIG. 8

| Coefficient | M6 | M5 | M4 |
|---|---|---|---|
| KY | 0.00000000 | 0.00000000 | 0.00000000 |
| KX | 0.00000000 | 0.00000000 | 0.00000000 |
| RX | −968.48355690 | −2498.98847300 | −1133.26755100 |
| C7 | 2.71479076e−08 | 2.38822103e−08 | 5.18478549e−08 |
| C9 | 4.50253775e−07 | −5.82781648e−07 | −1.67154307e−07 |
| C10 | −2.38451556e−11 | 2.67748483e−10 | −9.46381917e−12 |
| C12 | 4.30579082e−11 | −4.25654263e−10 | 7.36299899e−11 |
| C14 | −2.4711783e−09 | 1.3760893e−09 | −8.86739937e−10 |
| C16 | −3.0166759e−14 | −1.18886983e−13 | 3.73313098e−14 |
| C18 | 1.51795315e−13 | 1.05119112e−12 | 4.89955903e−13 |
| C20 | −1.11842171e−11 | −1.02796302e−11 | −1.03855915e−12 |
| C21 | −4.38027685e−16 | 7.23804953e−16 | −3.17084595e−17 |
| C23 | 2.94021396e−16 | 1.2161582e−15 | −8.72640496e−17 |
| C25 | −8.19459328e−15 | 6.90529718e−15 | 2.89506882e−16 |

TABLE 2a-continued for FIG. 8

| Coefficient | M6 | M5 | M4 |
| --- | --- | --- | --- |
| C27 | 2.96082749e−14 | 1.62335524e−13 | −1.92565332e−14 |
| C29 | 8.60162409e−19 | −3.80345575e−20 | −3.37480125e−19 |
| C31 | −6.84103825e−19 | 2.06738273e−17 | −1.97780822e−18 |
| C33 | −1.11737082e−16 | 3.69643038e−16 | −1.28976097e−17 |
| C35 | 1.08354982e−15 | 2.74612487e−15 | 3.04382917e−17 |
| C36 | 3.28699855e−21 | −4.01375785e−21 | 2.85010977e−22 |
| C38 | −3.63003086e−21 | −6.86793617e−20 | 2.98666771e−22 |
| C40 | −1.04682433e−19 | −1.67806835e−18 | 1.37454187e−20 |
| C42 | −8.34253741e−19 | −1.30983408e−17 | 1.27520801e−18 |
| C44 | −3.53004244e−19 | −1.10923739e−16 | 3.75132186e−19 |
| C46 | −8.59086839e−24 | −4.53708166e−23 | 6.93130365e−24 |
| C48 | 2.33469983e−23 | −2.70949243e−21 | 8.0706122e−23 |
| C50 | 9.74044956e−22 | −3.68481729e−20 | 1.90696171e−22 |
| C52 | 1.75499222e−21 | −3.90731597e−19 | 1.13715718e−20 |
| C54 | 2.76531931e−22 | −1.42353493e−18 | 1.48530987e−20 |
| C55 | −2.51671657e−26 | 5.24413058e−26 | −1.10613924e−27 |
| C57 | 1.13867747e−25 | 2.11435786e−24 | 1.30295959e−27 |
| C59 | 1.02120349e−24 | 7.0789904e−23 | 5.63037564e−25 |
| C61 | −1.44568406e−23 | 6.81414019e−22 | −1.59831374e−23 |
| C63 | 1.96690934e−25 | 4.59940643e−21 | 4.9503818e−23 |
| C65 | 8.67568878e−27 | 5.66740266e−20 | −3.25356538e−23 |
| C67 | 8.01923372e−29 | 1.59623471e−27 | −8.78900254e−29 |
| C69 | 5.57427946e−28 | 1.42365539e−25 | −2.26578867e−27 |
| C71 | −3.71592863e−26 | 2.25136987e−24 | −2.65100898e−26 |
| C73 | 1.44177299e−26 | 2.33249146e−23 | 8.29144894e−26 |
| C75 | 2.01177357e−27 | 2.29415044e−22 | 1.51560525e−25 |
| C77 | 7.26648539e−27 | 2.85367154e−22 | −1.10865442e−24 |
| C78 | 1.34152974e−31 | −5.3602576e−31 | −2.20619757e−32 |
| C80 | −1.17007849e−30 | −2.45062945e−29 | 2.03748582e−31 |
| C82 | 7.94880812e−30 | −7.15731597e−28 | −5.26667521e−30 |
| C84 | −5.50958312e−29 | −6.817699e−27 | −1.22583266e−28 |
| C86 | −1.94794209e−29 | 2.30065328e−25 | −9.16323672e−28 |
| C88 | −6.81563149e−29 | −1.46061264e−24 | −5.67205402e−27 |
| C90 | −5.31567946e−30 | −1.09966662e−23 | 2.71186838e−27 |
| C92 | −4.38371244e−34 | −2.79084223e−32 | 6.88443414e−34 |
| C94 | −8.00478362e−33 | −3.37612488e−30 | 3.08624138e−32 |
| C96 | −6.20058279e−32 | −6.65274277e−29 | 4.62159143e−31 |
| C98 | −3.01149404e−32 | −3.22246813e−28 | −1.35134045e−31 |
| C100 | −1.05503293e−31 | −7.85822522e−27 | −6.67608152e−30 |
| C102 | 3.84125315e−32 | −5.44423491e−26 | −1.51978258e−29 |
| C104 | −1.96381619e−31 | −5.5066299e−26 | 5.93424415e−29 |
| C105 | −4.6168179e−37 | 2.97613169e−36 | 3.81716342e−37 |
| C107 | 5.91098816e−36 | −2.08205204e−34 | −1.44707866e−36 |
| C109 | −3.94111521e−34 | −2.08945805e−32 | −2.31713769e−34 |
| C111 | −1.02044776e−33 | −2.70330967e−31 | 3.59093564e−33 |
| C113 | −1.45808696e−34 | −1.08130586e−29 | 2.12834934e−32 |
| C115 | 4.22529657e−34 | −8.20779772e−29 | 1.27910573e−31 |
| C117 | 1.05802873e−33 | 4.9754284e−29 | 4.82703379e−31 |
| C119 | −2.0401379e−35 | 8.87326617e−28 | −1.15560265e−31 |
| C121 | 1.06079386e−39 | 1.85425557e−37 | −2.51462333e−39 |
| C123 | 6.91750047e−39 | 3.01103541e−35 | −1.75716316e−37 |
| C125 | 7.17212519e−37 | 7.31634676e−34 | −8.20528663e−37 |
| C127 | 5.81658235e−37 | −3.23277325e−33 | −5.0358984e−36 |
| C129 | 1.25451773e−36 | 1.91528349e−32 | 4.88269155e−35 |
| C131 | 9.5284737e−37 | 6.54627098e−31 | 3.54476859e−34 |
| C133 | −1.40839621e−36 | 4.18034791e−30 | 5.42004727e−34 |
| C135 | 1.96005638e−36 | 4.16743287e−30 | −1.17769788e−33 |
| C136 | 7.15307913e−43 | −2.48199327e−42 | −1.97988292e−42 |
| C138 | −1.32248524e−41 | 4.91108717e−39 | −8.40685621e−42 |
| C140 | 1.56291407e−39 | 4.35844123e−37 | 2.14879574e−39 |
| C142 | 9.12130255e−40 | 2.92879638e−36 | −5.71398609e−39 |
| C144 | 3.76900111e−39 | 4.89059906e−35 | −1.87644253e−37 |
| C146 | −5.56992337e−39 | 9.54765618e−34 | −1.28751058e−36 |
| C148 | 6.27589068e−39 | 7.17013086e−33 | −6.21469536e−36 |
| C150 | −3.26483004e−40 | 7.38680415e−33 | −1.58327962e−35 |
| C152 | 3.52243136e−39 | −1.37505796e−32 | 1.08607917e−36 |

TABLE 2b for FIG. 8

| Coefficient | M3 | M2 | M1 |
|---|---|---|---|
| KY | 0.00000000 | 0.00000000 | 0.00000000 |
| KX | 0.00000000 | 0.00000000 | 0.00000000 |
| RX | 3080.84896500 | −33479.91021000 | −3172.72861600 |
| C7 | −1.62849414e−07 | 3.07218764e−07 | 8.79477432e−09 |
| C9 | −9.66035493e−07 | −2.86018974e−07 | 7.95759287e−09 |
| C10 | 2.36416343e−11 | −1.38295186e−12 | −7.03362708e−13 |
| C12 | 4.89710462e−10 | −6.9111035e−10 | −5.08235251e−12 |
| C14 | 1.40425828e−08 | 1.26543214e−09 | 2.07361083e−13 |
| C16 | −9.11215525e−13 | 2.21119426e−13 | 2.28697716e−15 |
| C18 | −6.2634508e−12 | 6.0780485e−13 | 3.4380682e−15 |
| C20 | −1.23370704e−10 | −3.10506318e−12 | 2.28272412e−15 |
| C21 | 8.09238883e−15 | −1.2098357e−16 | 9.98685851e−19 |
| C23 | −9.36009431e−15 | −2.83859151e−16 | −1.87796444e−18 |
| C25 | 2.70855096e−13 | −1.02053055e−14 | 3.13134922e−19 |
| C27 | −4.67542827e−12 | −1.67907065e−13 | 3.37030827e−18 |
| C29 | 3.13793825e−17 | −9.62885646e−20 | −5.61599889e−21 |
| C31 | −6.38124682e−17 | 6.20891428e−17 | −7.09657394e−21 |
| C33 | −2.69698729e−15 | 2.0254306e−16 | 5.13911197e−21 |
| C35 | 5.68203721e−14 | 8.71113009e−15 | 2.09358971e−20 |
| C36 | −2.2909227e−19 | 3.27512151e−21 | −2.21596654e−23 |
| C38 | 4.22819874e−19 | −9.67747324e−21 | 3.9710395e−23 |
| C40 | 1.63617533e−17 | 8.92907743e−20 | −1.40157551e−23 |
| C42 | 1.59457579e−16 | 1.79035375e−17 | −2.02963463e−22 |
| C44 | 1.18216765e−15 | 2.78779177e−16 | −1.59374128e−22 |
| C46 | −1.06467412e−21 | −6.58647296e−24 | 1.24715355e−25 |
| C48 | −1.6490057e−20 | −2.46516555e−22 | 3.8338832e−25 |
| C50 | 7.64523168e−20 | −8.74311459e−21 | 3.44466213e−25 |
| C52 | 1.47615711e−18 | −3.80362036e−19 | −3.45022776e−25 |
| C54 | −3.33841759e−18 | −9.26729234e−18 | −5.93067611e−25 |
| C55 | 4.4045967e−24 | −6.83380624e−26 | 2.61216345e−28 |
| C57 | −4.39572295e−23 | 2.42586528e−25 | −8.98639048e−28 |
| C59 | 9.34015541e−23 | 5.86712869e−24 | −1.91036037e−27 |
| C61 | −6.78345318e−21 | −2.21256883e−22 | 2.58436477e−27 |
| C63 | 1.79666076e−21 | −1.97246842e−20 | 6.83273571e−27 |
| C65 | 1.70487191e−20 | −2.51119373e−19 | 4.26891017e−27 |
| C67 | 3.9670632e−26 | 4.83098158e−28 | −1.19220483e−30 |
| C69 | 1.78791349e−24 | 4.26736665e−27 | −7.49118954e−30 |
| C71 | −1.23723912e−23 | 1.91264416e−25 | −1.28913906e−29 |
| C73 | 3.17598395e−23 | 9.70127521e−24 | −4.79056132e−30 |
| C75 | 3.9232763e−23 | 3.40183855e−22 | 1.04540849e−29 |
| C77 | 9.56888355e−22 | 5.56406535e−21 | 1.00871406e−29 |
| C78 | −5.54877924e−29 | 1.38754503e−30 | −3.08861791e−33 |
| C80 | 1.52787328e−27 | 1.63877532e−30 | 8.43697978e−33 |
| C82 | −4.27456871e−26 | 9.47429055e−29 | 3.97453016e−32 |
| C84 | −2.86830457e−27 | −7.28223456e−27 | 2.77448909e−32 |
| C86 | 5.05061206e−25 | 4.80942249e−26 | −9.03912804e−32 |
| C88 | 3.5100496e−24 | 1.19777433e−23 | −1.22188168e−31 |
| C90 | 8.00417945e−25 | 1.37965754e−22 | −6.68888397e−32 |
| C92 | −8.17584299e−31 | −1.0360724e−32 | 4.30153595e−36 |
| C94 | −7.67971306e−29 | −2.51068851e−33 | 6.13331495e−35 |
| C96 | −5.73210941e−28 | 7.11642527e−31 | 1.77765315e−34 |
| C98 | 1.0272047e−27 | −1.22956319e−28 | 1.51095348e−34 |
| C100 | 5.84014326e−27 | −5.32748779e−27 | 1.10140724e−35 |
| C102 | −5.05296644e−27 | −1.43328363e−25 | −1.31596298e−34 |
| C104 | −1.41038149e−25 | −1.77767188e−24 | −9.10955637e−35 |
| C105 | 3.34782334e−34 | −1.80443002e−35 | 2.37470443e−38 |
| C107 | −2.32493713e−32 | −8.75195275e−35 | −4.41095086e−38 |
| C109 | 3.0704453e−30 | −1.1418279e−32 | −2.36499079e−37 |
| C111 | −2.17298131e−29 | 8.60275856e−32 | −7.48546385e−37 |
| C113 | −2.58263405e−29 | 8.01578507e−30 | 9.81162786e−38 |
| C115 | −2.63459204e−28 | 2.95229612e−29 | 1.22180185e−36 |
| C117 | −1.05779279e−27 | −3.86260274e−27 | 1.09635921e−36 |
| C119 | −8.24135518e−28 | −4.18521321e−26 | 5.58463206e−37 |
| C121 | 6.68063169e−36 | 8.01799492e−38 | 3.04676477e−43 |
| C123 | 8.71542728e−34 | −2.19028252e−37 | −1.59815624e−40 |
| C125 | 2.06204095e−32 | −4.64300424e−35 | −8.3689699e−40 |
| C127 | 1.34616847e−32 | 2.85082471e−34 | −1.02425716e−39 |
| C129 | −1.73827298e−31 | 2.70240157e−32 | −6.20491072e−40 |
| C131 | −8.04255604e−31 | 1.13757235e−30 | 1.55098535e−40 |
| C133 | 4.52613769e−31 | 2.27235068e−29 | 5.90328407e−40 |
| C135 | 7.99527241e−30 | 2.36424003e−28 | 3.38663065e−40 |
| C136 | 2.49516979e−40 | 9.99188283e−41 | −7.75718764e−44 |
| C138 | 1.69262218e−37 | 3.57667022e−40 | 1.67630659e−43 |
| C140 | −4.95558732e−35 | 1.46907421e−37 | 1.66310089e−43 |
| C142 | 2.93093797e−35 | 1.30595616e−36 | 3.64449976e−42 |
| C144 | 4.92866369e−34 | −7.83674664e−35 | 3.11445265e−42 |

TABLE 2b-continued for FIG. 8

| Coefficient | M3 | M2 | M1 |
|---|---|---|---|
| C146 | 5.65347009e−33 | −2.44404559e−33 | −2.31909785e−42 |
| C148 | 4.13422705e−32 | −7.63243368e−33 | −5.80945139e−42 |
| C150 | 1.11863576e−31 | 5.02520445e−31 | −3.86976442e−42 |
| C152 | 1.00517702e−31 | 5.31002648e−30 | −1.90891629e−42 |

TABLE 3a for FIG. 8

| Surface | DCX | DCY | DCZ |
|---|---|---|---|
| Image field | 0.00000000 | 0.00000000 | 0.00000000 |
| M6 | 0.00000000 | 0.00000000 | 612.97101665 |
| M5 | 0.00000000 | 136.85661780 | 103.66062559 |
| M4 | 0.00000000 | −41.39430151 | 1546.93296209 |
| M3 | 0.00000000 | 263.62325906 | 925.02290129 |
| AS | 0.00000000 | 292.58714069 | 1198.77192769 |
| M2 | 0.00000000 | 346.52916071 | 1708.59915502 |
| M1 | 0.00000000 | 602.65729956 | 250.11832264 |
| Object field | 0.00000000 | 906.02808523 | 2164.33665368 |

TABLE 3b for FIG. 8

| Surface | TLA[deg] | TLB[deg] | TLC[deg] |
|---|---|---|---|
| Image field | −0.00000000 | 0.00000000 | −0.00000000 |
| M6 | 7.52032233 | 0.00000000 | −0.00000000 |
| M5 | 11.04064466 | 180.00000000 | 0.00000000 |
| M4 | 16.58320883 | −0.00000000 | −0.00000000 |
| M3 | 10.04304575 | 180.00000000 | 0.00000000 |
| AS | −19.58708049 | 0.00000000 | −0.00000000 |
| M2 | 1.96031849 | 0.00000000 | −0.00000000 |
| M1 | 0.47740892 | 180.00000000 | 0.00000000 |
| Object field | −0.00550066 | −0.00000000 | −0.00000000 |

TABLE 4 for FIG. 8

| X[mm] | Y[mm] | Z[mm] |
|---|---|---|
| −0.00000000 | 20.63455870 | 0.00000000 |
| −28.75585644 | 20.51705844 | 0.00000000 |
| −56.82826163 | 20.16211736 | 0.00000000 |
| −83.54564340 | 19.56100841 | 0.00000000 |
| −108.26284419 | 18.69649935 | 0.00000000 |
| −130.37719274 | 17.54430359 | 0.00000000 |
| −149.34332460 | 16.07661522 | 0.00000000 |
| −164.68613081 | 14.26220025 | 0.00000000 |
| −176.01316429 | 12.06806510 | 0.00000000 |
| −183.02682516 | 9.47268420 | 0.00000000 |
| −185.53480535 | 6.48505211 | 0.00000000 |
| −183.45858616 | 3.14716753 | 0.00000000 |
| −176.83801282 | −0.47006614 | 0.00000000 |
| −165.82902883 | −4.25603968 | 0.00000000 |
| −150.69821974 | −8.06223298 | 0.00000000 |
| −131.81534916 | −11.71718954 | 0.00000000 |
| −109.64368731 | −15.03754063 | 0.00000000 |
| −84.73045835 | −17.84353790 | 0.00000000 |
| −57.69511273 | −19.97552102 | 0.00000000 |
| −29.21366657 | −21.30797903 | 0.00000000 |
| −0.00000000 | −21.76120962 | 0.00000000 |
| 29.21366657 | −21.30797903 | 0.00000000 |
| 57.69511273 | −19.97552102 | 0.00000000 |
| 84.73045835 | −17.84353790 | 0.00000000 |
| 109.64368731 | −15.03754063 | 0.00000000 |
| 131.81534916 | −11.71718954 | 0.00000000 |
| 150.69821974 | −8.06223298 | 0.00000000 |
| 165.82902883 | −4.25603968 | 0.00000000 |
| 176.83801282 | −0.47006614 | 0.00000000 |
| 183.45858616 | 3.14716753 | 0.00000000 |
| 185.53480535 | 6.48505211 | 0.00000000 |
| 183.02682516 | 9.47268420 | 0.00000000 |
| 176.01316429 | 12.06806510 | 0.00000000 |
| 164.68613081 | 14.26220025 | 0.00000000 |
| 149.34332460 | 16.07661522 | 0.00000000 |
| 130.37719274 | 17.54430359 | 0.00000000 |
| 108.26284419 | 18.69649935 | 0.00000000 |
| 83.54564340 | 19.56100841 | 0.00000000 |
| 56.82826163 | 20.16211736 | 0.00000000 |
| 28.75585644 | 20.51705844 | 0.00000000 |

A distance between the object plane 5 and the image plane 9 is 2164 mm.

An object/image offset docs along the y-coordinate is 906 mm between a central object field point and a central image field point. A wavefront aberration (RMS) is approximately 100 m$\lambda$ in the projection optical unit 7.

What emerges on account of the different image-side numerical apertures, which emerge from the different imaging scales, and the position of the intermediate image planes is that the mirrors M2 to M5 have a x/y-. aspect ratio, which is respectively significantly greater than 1 and which may be greater than 4, greater than 5, greater than 6 and also greater than 8. This aspect ratio denotes the ratio of the x-extent to the y-extent of the reflection surfaces used for the mirrors M1 to M6.

What emerges, as shown in FIG. 9, is a very compact folding geometry of the mirrors M1 to M6 in the yz-plane, with correspondingly small angles of incidence, particularly on the minors M2, M5 and M6.

The reference axes of the minors M1 to M6 are generally tilted with respect to a normal of the image plane 9, as is made clear by the tilt values in the tables.

The stop AS can lie in a plane or else have a three-dimensional embodiment. The extent of the stop AS can be smaller in the scan direction (y) than in the cross-scan direction (x).

Figure 11:
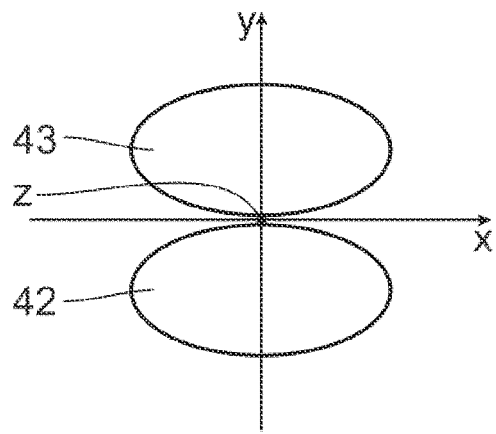
FIGS. 11 and 12 each show, in illustrations similar to FIG. 7, the numerical apertures of the illumination light beam paths to the lithography mask and reflected by the lithography mask for further embodiments of optical systems for illuminating the lithography mask and for imaging the original structure portions onto the image portions, specifically, in FIG. 11, an illumination angle space and an imaging angle space each embodied with an elliptical edge contour, and, in FIG. 12, an illumination angle space and an imaging angle space each embodied with a circular edge contour and coincident with one another.
Figure 12:
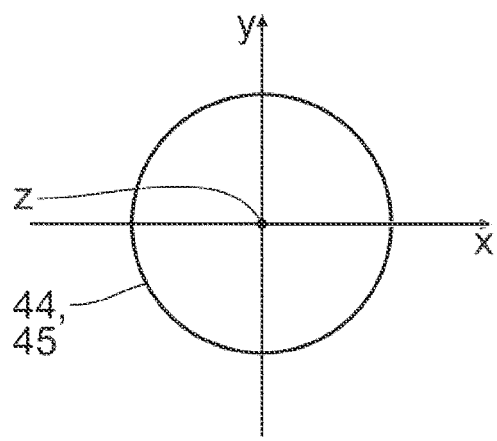

FIGS. 11 and 12 show variants for arranging the numerical apertures when illuminating and imaging the lithography mask 10, in each case in an illustration similar to FIG. 7. In the embodiment according to FIG. 11, both an illumination angle space 42 and an imaging angle space 43 are embodied with an elliptical edge contour and an x/y-aspect ratio of 2/1. As explained in conjunction with the anamorphic projection optical units known from the prior art (see US 2013/0128251 A1, DE 10 2014 208 770 A1 and US 2016/0327868 A1), this can achieve of a reduction a reflection folding angle on the lithography mask, which helps improve the imaging quality. In this case, the numerical apertures along the scanning direction y are half the size perpendicular thereto in the x-direction.

In the embodiment according to FIG. 12, the angle spaces 44, 45 of the illumination beam path, on the one hand incident on the lithography mask 10, and of the imaging beam path, on the other hand reflected by the lithography mask 10, coincide. This can be achieved by configuration of the optical system like in US 2015/0160561 A1, for example.

A further embodiment of a projection optical unit 46 is described below on the basis of FIGS. 13 and 14, it being possible to use said projection optical unit in place of the projection optical unit 7 in a projection exposure apparatus in the style of the projection exposure apparatus 1, in particular when using imaging light 3 with a DUV wavelength. Components and functions corresponding to those which have already been explained above on the basis of FIGS. 1 to 12, and in particular on the basis of FIGS. 8 to 10, bear the same reference numerals and will not be discussed in detail again.

The projection optical unit 46 is an example of a dioptric embodiment of the projection optical unit of the projection exposure apparatus 1. FIG. 13 shows the projection optical unit 46 in a meridional section, i.e. the beam path of the imaging light 3 in the yz-plane. FIG. 14 shows the imaging beam path of the projection optical unit 46 in the sagittal plane xz.

Figure 13:
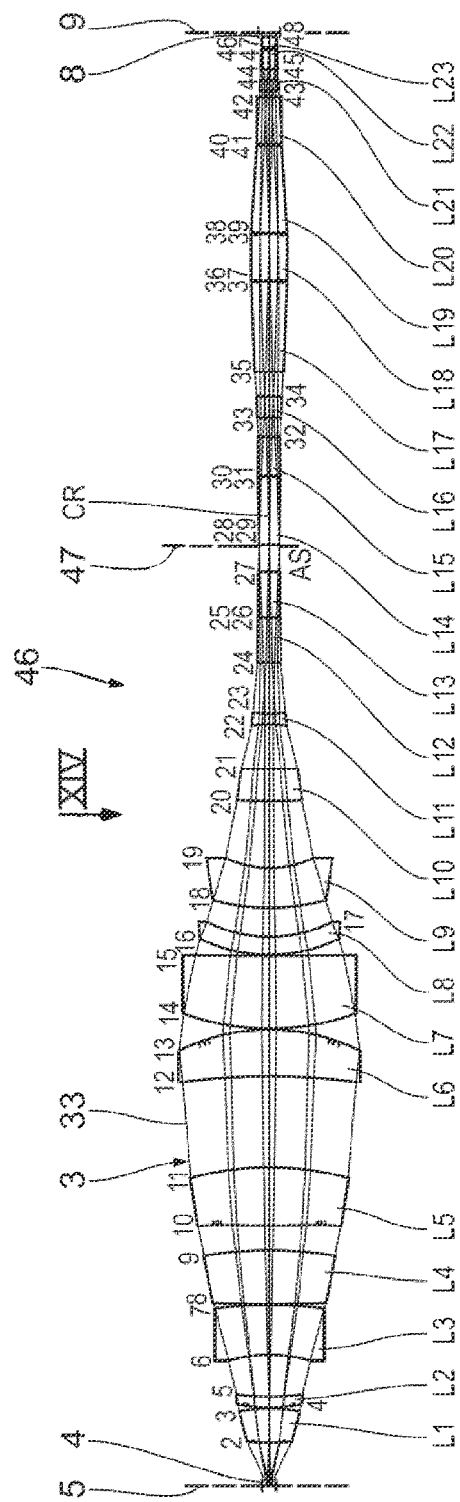
FIG. 13 shows a meridional section of a further embodiment of an imaging optical unit, which is usable as projection optical unit in the projection exposure apparatus of FIG. 1, in particular for imaging light with a DUV wavelength.
Figure 14:
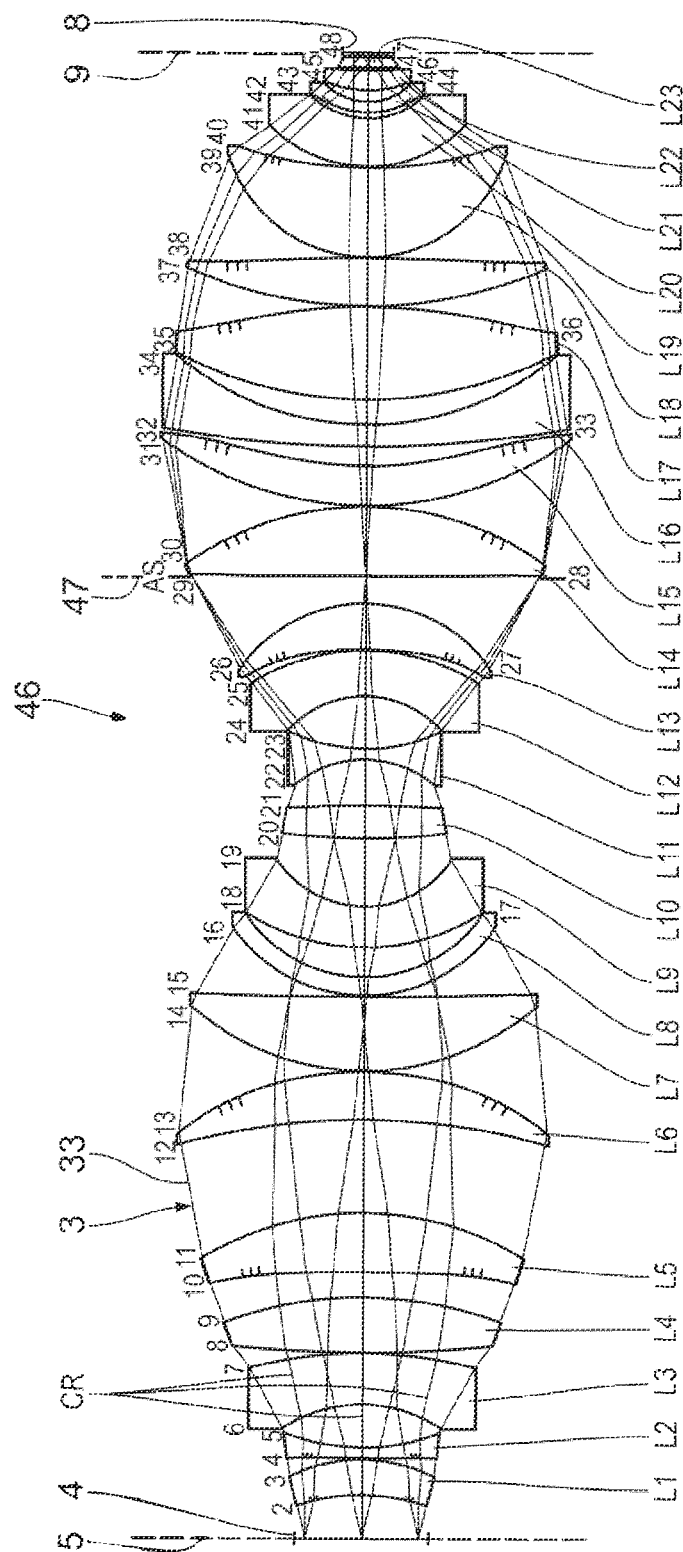
FIG. 14 shows a view from viewing direction XIV in FIG. 13.

What is illustrated in FIGS. 13 and 14 is, in each case, the beam path of respectively three individual rays 33, which respectively emanate from the object field points spaced apart in the y-direction (FIG. 13) or in the x-direction (FIG. 14). Once again, chief rays CR and, in each case, an upper and lower ray of these three object field points are illustrated. Proceeding from the object field 4, the chief ray CR of the central object field point is perpendicular to the object plane 5; i.e., it extends parallel to the normal of the object plane 5. Accordingly, the angle CRA is 0°.

In the imaging light beam path between the object field 4 and the image field 8, the projection optical unit 46 has a total of twenty-three lens elements, which are denoted by L1 to L23 in the sequence of their impingement along the imaging light beam path in FIGS. 13 and 14.

In the projection optical unit 46, too, the object plane 5 lies parallel to the image plane 9.

The lens elements L1 to L23 carry a reflection-minimizing coating on their respective lens element surfaces. The lens elements L1 to L23 are made of $SiO_2$.

In the imaging light plane xz, the projection optical unit 46 has a numerical aperture $NA_O$, xz of 0.225 on the object side. In the second imaging light plane yz, the projection optical unit 46 has a numerical aperture $NA_O$, yz of likewise 0.225 on the object side. On the image side, the projection optical unit 46 has a numerical aperture $NA_I$, xz of 0.9 in the first imaging light plane and a numerical aperture $NA_I$, yz of 0.9/16=0.05625 in the second imaging light plane.

The projection optical unit 46 has no intermediate image.

A pupil plane 47 lies immediately in front of the lens element L14 in the imaging light beam path.

A pupil of the projection optical unit 46 is strongly elliptical in the region of the pupil plane 47, with the principal axis in the yz-plane being multiple times smaller than in the xz-plane.

The lens elements L1 to L23 all have an x/y-aspect ratio of their used reflection surfaces that is greater than 1. This x/y-aspect ratio is smaller in the region of a first lens element group L1 to L13 than in the region of a second lens element group L14 to L23.

The projection optical unit 46 has a pronounced waist in the meridional section in the region of the lens elements L10 and L11. There is a waist in the region of the lens elements L14 and L15 in the sagittal plane.

An aperture stop AS for delimiting the pupil at the edge side in the pupil plane 47 is arranged in the region of the pupil plane 47. In the projection optical unit 46, this aperture stop AS can also be arranged as a coating of an input surface of the lens element L14.

The projection optical unit 46 is telecentric on the image side.

The refractive input and output surfaces of the lens elements L1 to L23 are embodied as free-form surfaces which are not describable by a rotationally symmetric function. Other embodiments of the projection optical unit 46, in which at least one such surface of the lens elements L1 to L23 is embodied as a rotationally symmetric asphere, are also possible. What was explained above in conjunction with the reflection surfaces of the mirrors M1 to M6 applies here accordingly.

The projection optical unit 46 is designed for an operating wavelength of the illumination/imaging light 3 of 193.4 nm. The object field 4 has an x-extent of 104 mm and a y-extent of 3.25 mm.

The following applies to the imaging scales $\beta_x$, $\beta_y$ of the projection optical unit 46: $\beta_x$=−0.25 and $\beta_y$=−4.

A wavefront aberration RMS is 30.0 mλ in the projection optical unit 46.

The optical design data of the refractive surfaces of the lens elements L1 to L23 of the projection optical unit 46 can be gathered from the following tables. These optical design data proceed from the object plane 5, i.e., describe the projection optical unit 46 along the imaging beam path between the object plane 5 and the image plane 9.

The first of the following tables tabulates the optical surfaces of the components of the projection optical unit 46, i.e., of the lens elements L1 to L23, the aperture stop AS and also the object plane 5 and the image plane 9. The table 1 starts with the object plane 5 as surface numbered 1. The numbered surfaces 2 to 27 describe the entrance and exit surfaces of the lens elements L1 to L13, in the sequence of passage in the imaging beam path. The surface 28 describes the aperture stop AS. Surfaces 29 to 48 describe the entrance and exit surfaces of the lens elements L14 to L23. The surface 49 describes the position of the image plane 9. The radius $R_y$ and distance between the respective surface and the subsequent surface in the z-direction are tabled in Table 1 in relation to the projection optical unit 46 (Table 1 in relation to FIG. 13). Moreover, the material and index of refraction (refractive index) is specified in each case for the lens elements L1 to L23.

For the projection optical unit 46, the following Tables 2a to 2d tabulate, in a manner corresponding to Table 2 in relation to the projection optical unit 7, the conical constants $k_x$, $k_y$, the vertex radius $R_x$ and the free-form coefficients $C_n$ for the entrance surface of the lens element L1 (S2), the entrance surface of the lens element L2 (S4), the entrance surface of the lens element L5 (S10), the exit surface of the lens element L6 (S13), the entrance surface of the lens element L13 (S26), the exit surface of the lens element L14 (S30), the exit surface of the lens element L15 (S23), the exit surface of the lens element L17 (S36), the exit surface of the lens element L18 (S38), the exit surface of the lens element L19 (S40) and the entrance surface of the lens element L21

(S43). The other refractive surfaces of the lens elements L1 to L23 of the projection optical unit 46, which are not listed in Table 2, are described in rotationally symmetric fashion and the specification of the radius value in Table 1 suffices to completely describe the surface.

In a manner comparable to Table 4 in relation to the projection optical unit 7, Table 3 of the projection optical unit 46 once again describes an inner edge contour of the aperture stop AS that delimits the imaging light beam path on the edge side in the pupil plane 47. What was explained in relation to the fourth table of the projection optical unit 7 applies here in corresponding fashion.

TABLE 1 for FIG. 13

| Surface | Radius [mm] | Distance [mm] | Material | Refractive index |
|---|---|---|---|---|
| 1 | 0 | 40 | | 1.0003 |
| 2 | 184.0608724 | 32.17187772 | SIO2 | 1.5608 |
| 3 | −145.8539009 | 1 | | 1.0003 |
| 4 | 140.8894236 | 10 | SIO2 | 1.5608 |
| 5 | 190.9069192 | 39.73255276 | | 1.0003 |
| 6 | −130.6904464 | 46.69232795 | SIO2 | 1.5608 |
| 7 | −413.9751474 | 1 | | 1.0003 |
| 8 | 1213.98422 | 50.69774731 | SIO2 | 1.5608 |
| 9 | −361.4897692 | 23.30771465 | | 1.0003 |
| 10 | 1604.638177 | 54.38485689 | SIO2 | 1.5608 |
| 11 | −281.390086 | 85.87401513 | | 1.0003 |
| 12 | −629.3692639 | 44.11214702 | SIO2 | 1.5608 |
| 13 | −187.469574 | 1 | | 1.0003 |
| 14 | 241.1124912 | 68.3646769 | SIO2 | 1.5608 |
| 15 | 4455.828003 | 1 | | 1.0003 |
| 16 | 146.8468242 | 17.05698866 | SIO2 | 1.5608 |
| 17 | 130.9990293 | 27.2549268 | | 1.0003 |

TABLE 1-continued for FIG. 13

| Surface | Radius [mm] | Distance [mm] | Material | Refractive index |
|---|---|---|---|---|
| 18 | 198.982844 | 37.68575323 | SIO2 | 1.5608 |
| 19 | 95.48462035 | 62.80817611 | | 1.0003 |
| 20 | 611.7555944 | 30 | SIO2 | 1.5608 |
| 21 | −1106.309165 | 41.96706992 | | 1.0003 |
| 22 | −99.12465396 | 10 | SIO2 | 1.5608 |
| 23 | 160.7162415 | 48.34244249 | | 1.0003 |
| 24 | −93.50496938 | 41.82450564 | SIO2 | 1.5608 |
| 25 | −198.2907363 | 1 | | 1.0003 |
| 26 | −134.7300227 | 42.15372662 | SIO2 | 1.5608 |
| 27 | −139.9958845 | 24.15001081 | | 1.0003 |
| 28 | 0 | 1.305978744 | | 1.0003 |
| 29 | 13333.08728 | 63.9716532 | SIO2 | 1.5608 |
| 30 | −200.8170959 | 1 | | 1.0003 |
| 31 | 319.1030647 | 36.49332227 | SIO2 | 1.5608 |
| 32 | 80.07255467 | 18.1514746 | | 1.0003 |
| 33 | 1072.206696 | 20 | SIO2 | 1.5608 |
| 34 | 270.2476873 | 23.08392254 | | 1.0003 |
| 35 | 377.8660628 | 85.29848884 | SIO2 | 1.5608 |
| 36 | −405.5481291 | 1 | | 1.0003 |
| 37 | 410.1300498 | 43.89442439 | SIO2 | 1.5608 |
| 38 | −262.6152625 | 1 | | 1.0003 |
| 39 | 133.2195869 | 82.41836975 | SIO2 | 1.5608 |
| 40 | 111.3102152 | 1 | | 1.0003 |
| 41 | 124.4326236 | 44.49595531 | SIO2 | 1.5608 |
| 42 | 76.44442864 | 5.253931735 | | 1.0003 |
| 43 | 63.22897326 | 10 | SIO2 | 1.5608 |
| 44 | 55.81790317 | 10.63595003 | | 1.0003 |
| 45 | 105.2840349 | 17.64329741 | SIO2 | 1.5608 |
| 46 | 318.7542011 | 2.420417081 | | 1.0003 |
| 47 | 0 | 10 | SIO2 | 1.5608 |
| 48 | 0 | 4 | | 1.0003 |
| 49 | 0 | 0 | | 1.0003 |

TABLE 2a for FIG. 13

| Coefficient | S2 | S4 | S10 |
|---|---|---|---|
| KY | 0.000000000E+00 | 0.000000000E+00 | 0.000000000E+00 |
| KX | 0.000000000E+00 | 0.000000000E+00 | 0.000000000E+00 |
| RX | −1.842189411E+02 | 1.095692708E+03 | −2.485036185E+03 |
| C10 | 1.442245340E−08 | −8.625919190E−08 | −1.420443830E−08 |
| C12 | −2.538304330E−07 | 2.399470320E−07 | −5.380907490E−08 |
| C14 | −2.098650670E−06 | 4.665163190E−07 | −8.269947110E−08 |
| C21 | −1.594661920E−13 | −2.013957090E−12 | −2.048325620E−13 |
| C23 | 3.469645350E−11 | −2.649181810E−11 | −6.490577260E−13 |
| C25 | −1.499991740E−11 | −1.105632850E−10 | 2.092700060E−13 |
| C27 | 5.932072570E−10 | −7.078570330E−11 | −2.231385800E−13 |
| C36 | 2.466814910E−16 | −1.832704910E−16 | 1.082088040E−18 |
| C38 | −2.285915870E−15 | 1.676153510E−15 | 4.752566570E−18 |
| C40 | −3.231536800E−14 | 7.455883230E−15 | −2.123485090E−17 |
| C42 | 3.542411950E−14 | 1.128011710E−14 | −8.185840750E−17 |
| C44 | −1.044154920E−14 | −3.384590760E−14 | −8.299932060E−17 |
| C55 | 2.829760600E−20 | −1.001201830E−20 | −4.912677690E−23 |
| C57 | 2.474828960E−19 | −1.654051530E−19 | −5.735240310E−22 |
| C59 | 1.727921770E−18 | −8.983673910E−19 | −1.203204530E−21 |
| C61 | 2.765582880E−17 | −1.083859890E−18 | 1.058143680E−21 |
| C63 | 7.939791660E−17 | 1.957906150E−18 | 4.527114910E−21 |
| C65 | 1.322307410E−16 | 9.194215650E−18 | 3.130294840E−21 |

TABLE 2b for FIG. 13

| Coefficient | S13 | S26 | S30 |
|---|---|---|---|
| KY | 0.000000000E+00 | 0.000000000E+00 | 0.000000000E+00 |
| KX | 0.000000000E+00 | 0.000000000E+00 | 0.000000000E+00 |
| RX | −3.138110904E+02 | −3.998807636E+02 | −2.835561591E+02 |
| C10 | −7.965407740E−09 | −6.784483940E−08 | −8.105916480E−10 |
| C12 | −2.928490840E−09 | −3.674076470E−08 | 2.321229930E−09 |
| C14 | 6.893012880E−09 | −1.311664190E−07 | −1.139472610E−07 |
| C21 | −2.777429430E−14 | 4.485875560E−13 | −4.016567740E−14 |
| C23 | −1.190254960E−13 | 9.775546080E−13 | 2.018240790E−12 |
| C25 | 3.965228850E−14 | 2.264229570E−13 | 5.161451480E−11 |
| C27 | −4.613120790E−14 | −8.329698960E−10 | −1.028970770E−09 |
| C36 | 3.129147960E−19 | −2.378207400E−17 | 3.594504920E−18 |
| C38 | 1.427796650E−18 | −1.056164860E−16 | −4.454442860E−17 |
| C40 | 1.507213160E−18 | 3.426739720E−15 | −2.917943820E−15 |
| C42 | 2.930000820E−18 | 1.859452930E−13 | 3.367280800E−14 |
| C44 | 5.353345820E−18 | 5.215372580E−14 | −6.154637560E−12 |
| C55 | −9.135426480E−24 | −8.530450390E−22 | −7.063821560E−23 |
| C57 | −6.125315310E−23 | −4.448562430E−21 | 5.929482340E−22 |
| C59 | −7.418332170E−23 | −2.139021750E−19 | 7.283940210E−20 |
| C61 | 1.953166170E−22 | −1.539390010E−17 | 7.531312960E−19 |
| C63 | 4.368279360E−22 | −4.902014630E−16 | 5.759857590E−16 |
| C65 | 1.865904280E−22 | −5.536394170E−15 | 3.475504800E−14 |

TABLE 2c for FIG. 13

| Coefficient | S32 | S36 | S38 |
|---|---|---|---|
| KY | 0.000000000E+00 | 0.000000000E+00 | 0.000000000E+00 |
| KX | 0.000000000E+00 | 0.000000000E+00 | 0.000000000E+00 |
| RX | 3.244254019E+02 | −4.901400683E+02 | −1.919427962E+03 |
| C10 | −1.997581540E−08 | 5.861946940E−09 | −1.786167860E−09 |
| C12 | −9.672912100E−08 | −6.551923140E−08 | 1.021556490E−07 |
| C14 | −2.568264980E−06 | −5.490634060E−07 | 8.386118450E−07 |
| C21 | −3.074617300E−13 | 1.452228990E−14 | 3.865657960E−13 |
| C23 | −3.127122930E−12 | −2.039642170E−12 | 3.655710170E−12 |
| C25 | −9.448702110E−11 | 5.495665740E−11 | −8.302565590E−11 |
| C27 | 1.024931400E−09 | 1.076464920E−09 | −1.302367010E−09 |
| C36 | 7.169217650E−18 | 2.674700000E−18 | −4.325216020E−18 |
| C38 | −3.315682040E−17 | 1.301000890E−16 | −1.744550390E−16 |
| C40 | −2.853723530E−16 | 1.882785520E−15 | −5.646061590E−16 |
| C42 | −8.780580670E−14 | −6.572441110E−14 | 8.815760900E−14 |
| C44 | 1.628923700E−11 | −1.480406070E−12 | 1.177965780E−12 |
| C55 | −4.707610640E−23 | 2.442638710E−23 | 1.246450200E−23 |
| C57 | 9.530725750E−22 | −1.014287700E−21 | 4.769190260E−21 |
| C59 | 4.312385010E−20 | −4.763111180E−20 | 5.296097870E−20 |
| C61 | 9.826679820E−18 | −1.576175570E−18 | 1.321229440E−18 |
| C63 | −1.143221820E−15 | 1.006485190E−16 | −7.718265860E−17 |
| C65 | −9.015826990E−14 | 2.186930070E−15 | −1.617799390E−15 |

TABLE 2d for FIG. 13

| Coefficient | S40 | S43 |
|---|---|---|
| KY | 0.000000000E+00 | 0.000000000E+00 |
| KX | 0.000000000E+00 | 0.000000000E+00 |
| RX | 4.234171902E+02 | 7.827173507E+01 |
| C10 | 3.086845120E−08 | −1.056739910E−07 |
| C12 | −4.007369900E−07 | −9.750770830E−07 |
| C14 | −1.572166300E−06 | −6.370040030E−07 |
| C21 | −2.447773140E−12 | −4.062652990E−11 |
| C23 | −2.626676030E−12 | −2.644086650E−10 |
| C25 | 3.593159600E−10 | 1.094041710E−10 |
| C27 | 3.984422100E−09 | 2.269614810E−09 |
| C36 | 1.124818510E−16 | −7.878859080E−15 |
| C38 | 6.879486860E−16 | −5.806286130E−14 |
| C40 | −2.400885750E−14 | −8.954932250E−14 |

TABLE 2d-continued for FIG. 13

| Coefficient | S40 | S43 |
|---|---|---|
| C42 | −8.732576650E−13 | −7.890891660E−13 |
| C44 | −5.797083400E−12 | −1.153400800E−11 |
| C55 | −1.934832820E−21 | −1.932671170E−18 |
| C57 | −1.599971860E−20 | −2.100050060E−17 |
| C59 | 5.302914580E−19 | −5.917070900E−17 |
| C61 | 4.235009350E−17 | −3.999568200E−16 |
| C63 | 3.566684060E−16 | −4.135735370E−15 |
| C65 | 1.753547670E−14 | 1.075803630E−13 |

TABLE 3 for FIG. 13

| Coefficiente | X[mm] | Y[mm] | Z[mm] |
|---|---|---|---|
| | 0.00000000 | 9.34167000 | 0.00000000 |
| | 19.95338079 | 9.26150096 | 0.00000000 |
| | 39.80401181 | 9.01600649 | 0.00000000 |
| | 59.43943674 | 8.59079437 | 0.00000000 |
| | 78.72567019 | 7.96417691 | 0.00000000 |
| | 97.47829760 | 7.11132775 | 0.00000000 |
| | 115.38686454 | 6.00988075 | 0.00000000 |
| | 131.86420705 | 4.64604678 | 0.00000000 |
| | 145.82838231 | 3.02369703 | 0.00000000 |
| | 155.56249971 | 1.18349458 | 0.00000000 |
| | 159.11580967 | −0.77002849 | 0.00000000 |
| | 155.55507787 | −2.67305993 | 0.00000000 |
| | 145.81539876 | −4.37165984 | 0.00000000 |
| | 131.84873457 | −5.78561604 | 0.00000000 |
| | 115.37100162 | −6.90478932 | 0.00000000 |
| | 97.46252378 | −7.75680349 | 0.00000000 |
| | 78.71010789 | −8.38303456 | 0.00000000 |
| | 59.42502010 | −8.82508344 | 0.00000000 |
| | 39.79259868 | −9.11733143 | 0.00000000 |
| | 19.94701826 | −9.28372991 | 0.00000000 |
| | 0.00000000 | −9.33776949 | 0.00000000 |
| | −19.94701826 | −9.28372991 | 0.00000000 |
| | −39.79259868 | −9.11733143 | 0.00000000 |
| | −59.42502010 | −8.82508344 | 0.00000000 |
| | −78.71010789 | −8.38303456 | 0.00000000 |
| | −97.46252378 | −7.75680349 | 0.00000000 |
| | −115.37100162 | −6.90478932 | 0.00000000 |
| | −131.84873457 | −5.78561604 | 0.00000000 |
| | −145.81539876 | −4.37165984 | 0.00000000 |
| | −155.55507787 | −2.67305993 | 0.00000000 |
| | −159.11580967 | −0.77002849 | 0.00000000 |
| | −155.56249971 | 1.18349458 | 0.00000000 |
| | −145.82838231 | 3.02369703 | 0.00000000 |
| | −131.86420705 | 4.64604678 | 0.00000000 |
| | −115.38686454 | 6.00988075 | 0.00000000 |
| | −97.47829760 | 7.11132775 | 0.00000000 |
| | −78.72567019 | 7.96417691 | 0.00000000 |
| | −59.43943674 | 8.59079437 | 0.00000000 |
| | −39.80401181 | 9.01600649 | 0.00000000 |
| | −19.95338079 | 9.26150096 | 0.00000000 |

The chief ray CR of the central object field point extends along a straight line, which specifies a reference axis of the projection optical unit 46. Accordingly, an object-image offset is exactly 0 in the case of the projection optical unit 46.

In order to produce a microstructured or nanostructured component, the projection exposure apparatus 1 is used as follows: first, the reflection mask 10 or the reticle and the substrate or the wafer 11 are provided. Subsequently, a structure on the reticle 10 is projected onto a light-sensitive layer of the wafer 11 with the aid of the projection exposure apparatus 1. Then, a microstructure or nanostructure on the wafer 11, and hence the microstructured component, is produced by developing the light-sensitive layer.

What is claimed is:

1. Optical system for transferring original structure portions of a lithography mask comprising a plurality of the original structure portions to be imaged and separating portions,
    wherein the original structure portions are arranged in a line next to one another and are separated from one another by the separating portions, which do not carry any structures to be imaged,
    wherein the original structure portions have a first extent in a first dimension (x) and a second extent in a second dimension (y) that extends perpendicularly to the first dimension (x), wherein an aspect ratio (x/y) of the first and the second extents is greater than 4:1,
    wherein a transfer onto image portions of a substrate with a diameter (d) comprises imaging an object field, in which at least one of the original structure portions of the lithography mask is arrangeable, into an image field, in which at least one of the image portions of the substrate is arrangeable, and
    wherein the optical system is embodied such that
        an image of each of the original structure portions is transferred to a separate image portion and wherein the image portions onto which the images of the original structure portions are transferred are arranged in a line next to one another,
        a totality of the original structure portions on the lithography mask produce a totality of the image portions during the transfer, wherein the totality of the image portions have an overall length ($D_y$) in one direction (y) that is greater than half (d/2) the diameter (d) of the substrate.

2. The optical system of claim 1, wherein the transfer onto the image portions of the substrate comprises a reduction in the first dimension and a magnification in the second dimension.

3. The optical system of claim 2, wherein the magnification in the absolute value range is between 1.5 and 5.

4. The optical system of claim 2, wherein the reduction in the absolute value range is between ⅛ and ⅓.

5. Projection optical unit for projection lithography for imaging an object field, in which at least one original structure portion of a lithography mask is arrangeable, into an image field, in which at least one image portion of a substrate is arrangeable,
    wherein the projection optical unit has an anamorphic embodiment with different imaging scales ($\beta_x$, $\beta_y$) for two mutually perpendicular field coordinates (x, y), and
    wherein the projection optical unit is embodied such that one of the imaging scales ($\beta_x$) is reducing for one of the field coordinates (x) and the other of the imaging scales ($\beta_y$) is magnifying for the other of the field coordinates (y).

6. Projection optical unit according to claim 5, wherein the magnifying imaging scale ($\beta_y$) in the absolute value range is between 1.5 and 5.

7. Projection optical unit according to claim 5, wherein the reducing imaging scale ($\beta_x$) in the absolute value range is between ⅛ and ⅓.

8. Optical system comprising a projection optical unit according to claim 5.

9. Optical system comprising a projection optical unit according to claim 5.

10. Optical system according to claim 9, comprising:
    a mask holder arranged to hold the lithography mask, and to displace in an object displacement direction (y) in response to a mask displacement drive,
    a substrate holder arranged to hold the substrate and to displace along the object displacement direction (y) in a manner synchronized to the mask displacement drive in response to a substrate displacement drive.

11. Optical system according to claim 10, wherein the field coordinate for which the projection optical unit has a magnifying embodiment coincides with the object displacement direction (y).

12. Optical system according to claim 11, comprising an illumination optical unit for illuminating the object field with illumination light of a light source.

13. Optical system according to claim 11, further comprising a light source for the illumination light.

14. Projection exposure apparatus comprising an optical system according to claim 13.

15. Method for producing a structured component, comprising:
- providing a reticle provided with a structure and a wafer provided with a light-sensitive layer,
- projecting the structure on the reticle onto the light-sensitive layer of the wafer with the projection exposure apparatus according to claim 14,
- producing a microstructure or nanostructure on the wafer.

16. Lithography mask comprising a plurality of original structure portions to be imaged, which are arranged in a line respectively next to one another and are separated from one another by a plurality of separating portions that carry no structures to be imaged, wherein the original structure portions have a first extent in a first dimension (x) and a second extent in a second dimension (y) that extends perpendicularly to the first dimension (x), and wherein an aspect ratio (x/y) of the first and the second extents is greater than 4:1.

17. The lithography mask of claim 11, wherein the plurality of original structure portions are configured to be imaged with a reduction in the first dimension and a magnification in the second dimension.

18. The lithography mask of claim 17, wherein the magnification in the absolute value range is between 1.5 and 5.

19. The lithography mask of claim 17, wherein the reduction in the absolute value range is between ⅛ and ⅓.

* * * * *

UNITED STATES PATENT AND TRADEMARK OFFICE
CERTIFICATE OF CORRECTION

| | | |
|---|---|---|
| PATENT NO. | : 11,137,688 B2 | Page 1 of 1 |
| APPLICATION NO. | : 17/092978 | |
| DATED | : October 5, 2021 | |
| INVENTOR(S) | : Patra et al. | |

It is certified that error appears in the above-identified patent and that said Letters Patent is hereby corrected as shown below:

In the Specification

Column 18, Line 32, delete "docs" and insert -- $d_{OIS}$ --, therefor.

In the Claims

Column 26, Lines 47-48, In Claim 8, delete "8. Optical system comprising a projection optical unit according to claim 5." and insert
-- 8. Optical system according to claim 1, comprising a projection optical unit for projection lithography for imaging an object field, in which at least one original structure portion of a lithography mask is arrangeable, into an image field, in which at least one image portion of a substrate is arrangeable,
    wherein the projection optical unit has an anamorphic embodiment with different imaging scales ($β_x$, $β_y$) for two mutually perpendicular field coordinates (x, y), and
    wherein the projection optical unit is embodied such that one of the imaging scales ($β_x$) is reducing for one of the field coordinates (x) and the other of the imaging scales ($β_y$) is magnifying for the other of the field coordinates (y). --, therefor.

Column 27, Line 21, In Claim 17, delete "claim 11," and insert -- claim 16, --, therefor.

Signed and Sealed this
Twenty-eighth Day of March, 2023

Katherine Kelly Vidal
*Director of the United States Patent and Trademark Office*